United States Patent
Kuwahara et al.

(10) Patent No.: US 11,213,945 B2
(45) Date of Patent: Jan. 4, 2022

(54) ROBOT SIMULATOR, ROBOT SYSTEM AND SIMULATION METHOD

(71) Applicant: KABUSHIKI KAISHA YASKAWA DENKI, Kitakyushu (JP)

(72) Inventors: Koichi Kuwahara, Fukuoka (JP); Yoshifumi Onoyama, Fukuoka (JP); Kenichi Yasuda, Fukuoka (JP); Wataru Watanabe, Fukuoka (JP)

(*) Notice: Subject to any disclaimer, the term of this patent is extended or adjusted under 35 U.S.C. 154(b) by 424 days.

(21) Appl. No.: 15/898,663

(22) Filed: Feb. 19, 2018

(65) Prior Publication Data
US 2018/0236657 A1 Aug. 23, 2018

(30) Foreign Application Priority Data
Feb. 21, 2017 (JP) .............................. JP2017-030276

(51) Int. Cl.
*B25J 9/16* (2006.01)
*G05B 19/4061* (2006.01)
(Continued)

(52) U.S. Cl.
CPC ........... *B25J 9/1605* (2013.01); *B25J 9/1666* (2013.01); *B25J 9/1671* (2013.01); *B25J 9/1676* (2013.01);
(Continued)

(58) Field of Classification Search
CPC ...... B25J 9/1605; B25J 9/1666; B25J 9/1671; B25J 9/1676; B25J 9/1697; B25J 13/089;
(Continued)

(56) References Cited

U.S. PATENT DOCUMENTS 5,937,143 A * 8/1999 Watanabe .............. B25J 9/1671
 700/264
6,167,328 A * 12/2000 Takaoka ................. B25J 9/1671
 318/568.1
(Continued)

FOREIGN PATENT DOCUMENTS

CN 1680079 10/2005
CN 104875203 9/2015
(Continued)

OTHER PUBLICATIONS

Van Henten, E. J., E. J. Schenk, L. G. Van Willigenburg, J. Meuleman, and P. Barreiro. "Collision-free inverse kinematics of the redundant seven-link manipulator used in a cucumber picking robot." Biosystems engineering 106, No. 2 (2010): 112-124. (Year: 2010).*
(Continued)

*Primary Examiner* — Chuen-Meei Gan
(74) *Attorney, Agent, or Firm* — Soei Patent & Law Firm

(57) ABSTRACT

A robot simulator includes a storage device that stores model information related to the robot and an obstacle in the vicinity of the robot, and an acquisition device that obtains first input information defining a start position and an end position of operation of the robot. A processing device generates a path for moving the distal end portion of the robot from the start position to the end position while avoiding collisions between the robot and the obstacle based on the first input information and the model information. The processing device also generates image data including an illustration of the obstacle and an index indicating a via-point of the path.

18 Claims, 17 Drawing Sheets

(51) Int. Cl.
*G06F 30/20* (2020.01)
*B25J 13/08* (2006.01)
*G05B 19/425* (2006.01)
*G06T 1/00* (2006.01)

(52) U.S. Cl.
CPC .......... *B25J 9/1697* (2013.01); *B25J 13/089* (2013.01); *G05B 19/4061* (2013.01); *G05B 19/425* (2013.01); *G06F 30/20* (2020.01); *G06T 1/0014* (2013.01); *G05B 2219/35012* (2013.01); *G05B 2219/40121* (2013.01); *G05B 2219/40371* (2013.01); *G05B 2219/40466* (2013.01); *G05B 2219/40519* (2013.01); *G05B 2219/49143* (2013.01); *Y02P 90/02* (2015.11)

(58) Field of Classification Search
CPC ... G06F 30/20; G05B 19/4061; G05B 19/425; G06T 1/0014
See application file for complete search history.

(56) References Cited

U.S. PATENT DOCUMENTS

| | | | | |
|---|---|---|---|---|
| 6,292,715 | B1* | 9/2001 | Rongo | B25J 9/1664 318/568.1 |
| 8,742,290 | B2* | 6/2014 | Oe | B23K 26/0884 219/121.63 |
| 2003/0225479 | A1* | 12/2003 | Waled | B25J 9/1676 700/245 |
| 2005/0107921 | A1 | 5/2005 | Watanabe et al. | |
| 2005/0224479 | A1 | 10/2005 | Watanabe et al. | |
| 2008/0114492 | A1 | 5/2008 | Miegel et al. | |
| 2009/0326711 | A1 | 12/2009 | Chang et al. | |
| 2010/0023164 | A1* | 1/2010 | Yoshizawa | B25J 9/1664 700/252 |
| 2010/0204828 | A1* | 8/2010 | Yoshizawa | B25J 9/1666 700/245 |
| 2012/0215351 | A1 | 8/2012 | McGee et al. | |
| 2014/0236356 | A1* | 8/2014 | Kuwahara | G05B 19/425 700/264 |
| 2014/0236565 | A1* | 8/2014 | Kuwahara | B25J 9/1671 703/22 |
| 2014/0277737 | A1 | 9/2014 | Sekiyama et al. | |
| 2015/0239121 | A1* | 8/2015 | Takeda | B25J 9/1605 700/250 |
| 2015/0290801 | A1 | 10/2015 | Kuwahara | |
| 2015/0328776 | A1 | 11/2015 | Shiratsuchi | |
| 2015/0379171 | A1* | 12/2015 | Kuwahara | B25J 9/1605 703/13 |

FOREIGN PATENT DOCUMENTS

| | | |
|---|---|---|
| CN | 105269565 | 1/2016 |
| CN | 105437232 | 3/2016 |
| DE | 102012103830 | 11/2012 |
| JP | H5-250023 | 9/1993 |
| JP | H8-166809 | 6/1996 |
| JP | H9-085655 | 3/1997 |
| JP | H11-254379 | 9/1999 |
| JP | 2001-216015 | 8/2001 |
| JP | 2003-091304 | 3/2003 |
| JP | 2005-149016 | 6/2005 |
| JP | 2005-297097 | 10/2005 |
| JP | 4103057 | 6/2008 |
| JP | 2015-160277 | 9/2015 |
| JP | 2015-202523 | 11/2015 |
| WO | 2014122995 | 8/2014 |

OTHER PUBLICATIONS

Office Action issued in Japanese Patent Application No. P2017-030276, dated Dec. 3, 2019 (with English partial translation).
Extended Search Report in corresponding European Application No. 18157102.7, dated Jul. 27, 2018, 11 pages.
Office Action issued in Japanese Patent Application No. P2017-030276, dated Jun. 30, 2020 (with English partial translation).
Office Action issued in Japanese Patent Application No. P2017-030276, dated Feb. 2, 2021 (with English partial translation).
Office Action issued in European Patent Application No. 18157102.7, dated Mar. 1, 2021.
Office Action issued in Chinese Patent Application No. 201810141614.X, dated Mar. 31, 2021 (with English partial translation).

* cited by examiner

Fig.3

| VIA-POINTS | POSITION | | | POSTURE | | | MOVING SPEED | PATH GENERATION NECESSITY |
|---|---|---|---|---|---|---|---|---|
| | X | Y | Z | Rx | Ry | Rz | | |
| 0 | ... | ... | ... | ... | ... | ... | — | — |
| 1 | ... | ... | ... | ... | ... | ... | ... | UNNECESSARY |
| 2 | ... | ... | ... | ... | ... | ... | ... | NECESSARY |
| 3 | ... | ... | ... | ... | ... | ... | ... | UNNECESSARY |

ROBOT SIMULATOR, ROBOT SYSTEM AND SIMULATION METHOD

CROSS-REFERENCE TO RELATED APPLICATION

This application is based upon and claims the benefit of priority from Japanese Patent Application No. 2017-030276, filed on Feb. 21, 2017, the entire contents of which are incorporated herein by reference.

BACKGROUND

1. Field

The present disclosure relates to a robot simulator, a robot system, and a simulation method.

2. Description of the Related Art

Japanese Unexamined Patent Publication No. 2015-202523 discloses a teaching system including an image generation unit, a start point specifying unit, a via-point specifying unit, and a generation unit. The image generation unit generates a virtual image including a closed processing line set on a workpiece as a processing target of the robot. The start point specifying unit specifies a starting point at a position other than the processing line on the virtual image. The via-point specifying unit specifies a via-point on the processing line. The generation unit generates teaching data for the robot with respect to a route that traces the processing line from the starting point via the via-point and returns to the via-point again.

SUMMARY

A robot simulator according to one aspect of the present disclosure includes: a storage device that stores model information related to a robot and an obstacle in the vicinity of the robot; an acquisition device configured to obtain first input information defining a start point (start position) and an end point (end position) of operation of the robot; and a processing device configured to execute a plurality of operations including the generation of a path for moving a distal end portion of the robot from the start position to the end position between two teaching points while avoiding a collision between the robot and the obstacle based on the first input information and the model information and the generation of image data including an illustration of the obstacle and an index indicating a via-point of the path.

A robot system according to another aspect of the present disclosure includes the above-described robot simulator, a robot, and a robot controller configured to control the robot so as to move the distal end portion along the path.

A simulation method according to still another aspect of the present disclosure is a simulation method using a robot simulator, the method including: storing model information related to a robot and an obstacle in the vicinity of the robot; obtaining first input information defining at least two teaching points toward a start position and an end position of operation of the robot; generating a path for moving the distal end portion of the robot from the start position to the end position between the two teaching points while avoiding a collision between the robot and the obstacle based on the first input information and the model information; and generating image data including an illustration of the obstacle and an index indicating a via-point of the path.

BRIEF DESCRIPTION OF THE DRAWINGS

FIG. 3 is a table illustrating job content.

DETAILED DESCRIPTION

Figure 1:
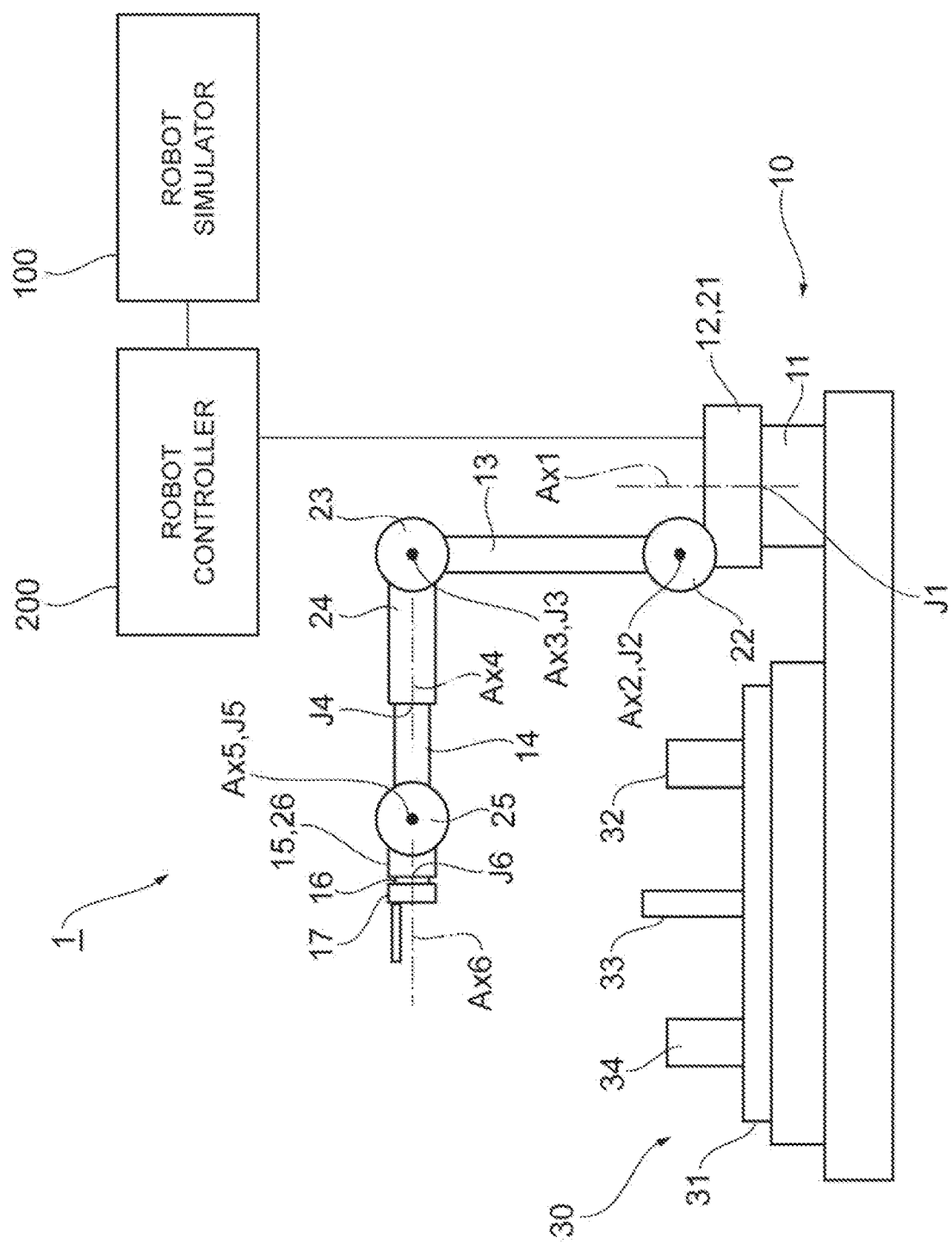
FIG. 1 is a schematic diagram illustrating an entire configuration of a robot system.

Hereinafter, embodiments will be described in detail with reference to the drawings. In the description, the same reference numerals will be used for the same elements or elements having a same function, and redundant descriptions will be omitted. A robot system according to the present embodiment is a system that automates various tasks such as machining and assembly by causing a robot to execute operations provided by an operator.

[Robot System]

As illustrated in FIG. 1, a robot system 1 includes a robot 10, a robot simulator 100, and a robot controller 200. The robot 10 is a six-axis vertical articulated robot, for example, being configured to execute tasks for a workpiece 30 using a tool provided at a distal end portion of the robot. Various tasks can be executed by selecting a tool according to the content of the task. Specific task content examples include pick-and-place in which components are picked and arranged, spot welding of components, and arc welding of components. FIG. 1 illustrates the robot 10 configured to perform arc welding of individual components.

The robot 10 includes a base 11, a rotating portion 12, a first arm 13, a second arm 14, a third arm 15, a distal end portion 16, and actuators 21 to 26.

The base 11 is fixed to an installation surface. The rotating portion 12 is provided on the base 11 and can rotate about a vertical axis Ax1. Hereinafter, a connecting portion between the base 11 and the rotating portion 12 will be referred to as a "joint J1", and a rotation angle of the rotating portion 12 with respect to the base 11 will be referred to as an "angle of the joint J1".

The first arm 13 is connected to the rotating portion 12 and is swingable about an axis Ax2 orthogonal to the axis Ax1. Being orthogonal involves crossing away from or over one another like an overpass. Hereinafter, a connecting portion between the rotating portion 12 and the first arm 13 will be referred to as "joint J2", and a swing angle of the first arm 13 with respect to the rotating portion 12 will be referred to as an "angle of the joint J2".

The second arm 14 is connected to the distal end portion of the first arm 13 and is swingable about an axis Ax3 parallel to the axis Ax2. Hereinafter, a connecting portion between the first arm 13 and the second arm 14 will be referred to as a "joint J3", and the swing angle of the second arm 14 with respect to the first arm 13 will be referred to as an "angle of the joint J3". The distal end portion of the second arm 14 can rotate about an axis Ax4 along the centerline of the second arm 14. Hereinafter, the connecting portion between a proximal end portion and the distal end portion of the second arm 14 will be referred to as a "joint J4", and the rotation angle of the distal end portion with respect to the proximal end portion of the second arm 14 will be referred to as an "angle of the joint J4".

The third arm 15 is connected to a distal end portion of the second arm 14 and is swingable about an axis Ax5 orthogonal to the axis Ax4. Hereinafter, a connecting portion between the second arm 14 and the third arm 15 will be referred to as a "joint J5", and the swing angle of the third arm 15 with respect to the second arm 14 will be referred to as an "angle of the joint J5".

The distal end portion 16 is connected to a distal end portion of the third arm 15, and the distal end portion 16 can rotate about an axis Ax6 along the centerline of the third arm 15. Hereinafter, a connecting portion between the third arm 15 and the distal end portion 16 will be referred to as a "joint J6", and the rotation angle of the distal end portion 16 with respect to the third arm 15 will be referred to as an "angle of the joint J6". A tool 17 is provided at the distal end portion 16. The tool 17 is, for example, a torch for arc welding and is detachable.

Each of the actuators 21 to 26 drives each of the joints J1 to J6 respectively using an electric motor as a power source, for example. Specifically, the actuator 21 rotates the rotating portion 12 about the axis Ax1, the actuator 22 swings the first arm 13 about the axis Ax2, the actuator 23 swings the second arm 14 about the axis Ax3, the actuator 24 rotates the distal end portion of the second arm 14 about the axis Ax4, the actuator 25 swings the third arm 15 about the axis Ax5, and the actuator 26 rotates the distal end portion 16 about the axis Ax6.

By adjusting the angles of the joints J1 to J6, it is possible to freely adjust the position and posture of the tool 17 of the distal end portion 16 in accordance with the workpiece 30.

The workpiece 30 includes elements that can be an obstacle to the movement of the robot 10. For example, the workpiece 30 includes a base component 31 and a plurality of components 32, 33, and 34 arranged on the component 31. For example, the robot 10 performs arc welding of the components 32, 33, and 34 onto the component 31. When moving the tool 17 from one weld to another weld, each of the components 32, 33, and 34 can be an obstacle. Note that the term "obstacle" does not represent one that constantly hinders the movement of the distal end portion 16, but represents one that can hinder the movement of the distal end portion 16 under a certain operating condition of the robot 10. In addition to components of the workpiece, peripheral apparatuses or jigs of the robot can also be obstacles, for example.

The configuration of the robot 10 illustrated above is merely an example. The robot 10 may have any configuration as long as the position and posture of the distal end portion can be adjusted to a desired state. For example, the robot 10 may be a seven-axis robot with one additional axis provided to the above-described configuration.

The robot simulator 100 simulates a positional relationship between the robot 10 and the workpiece 30 based on model information of the robot 10 and the workpiece 30 and generates a path of the robot 10 based on a result of simulation. The path is information defining a movement route of the distal end portion 16 of the robot simulator 100 and the posture of the robot 10 (that is, the angles of the joints J1 to J6) when the distal end portion 16 is moved along the route.

The robot controller 200 controls the robot 10 so as to move the distal end portion 16 along the above-described path (to operate the joints J1 to J6 in accordance with the above-described path).

The robot simulator 100 and the robot controller 200 may be integrated. For example, the function of the robot simulator 100 may be incorporated in the robot controller 200, or the function of the robot controller 200 may be incorporated in the robot simulator 100.

[Robot Simulator]

Figure 2:
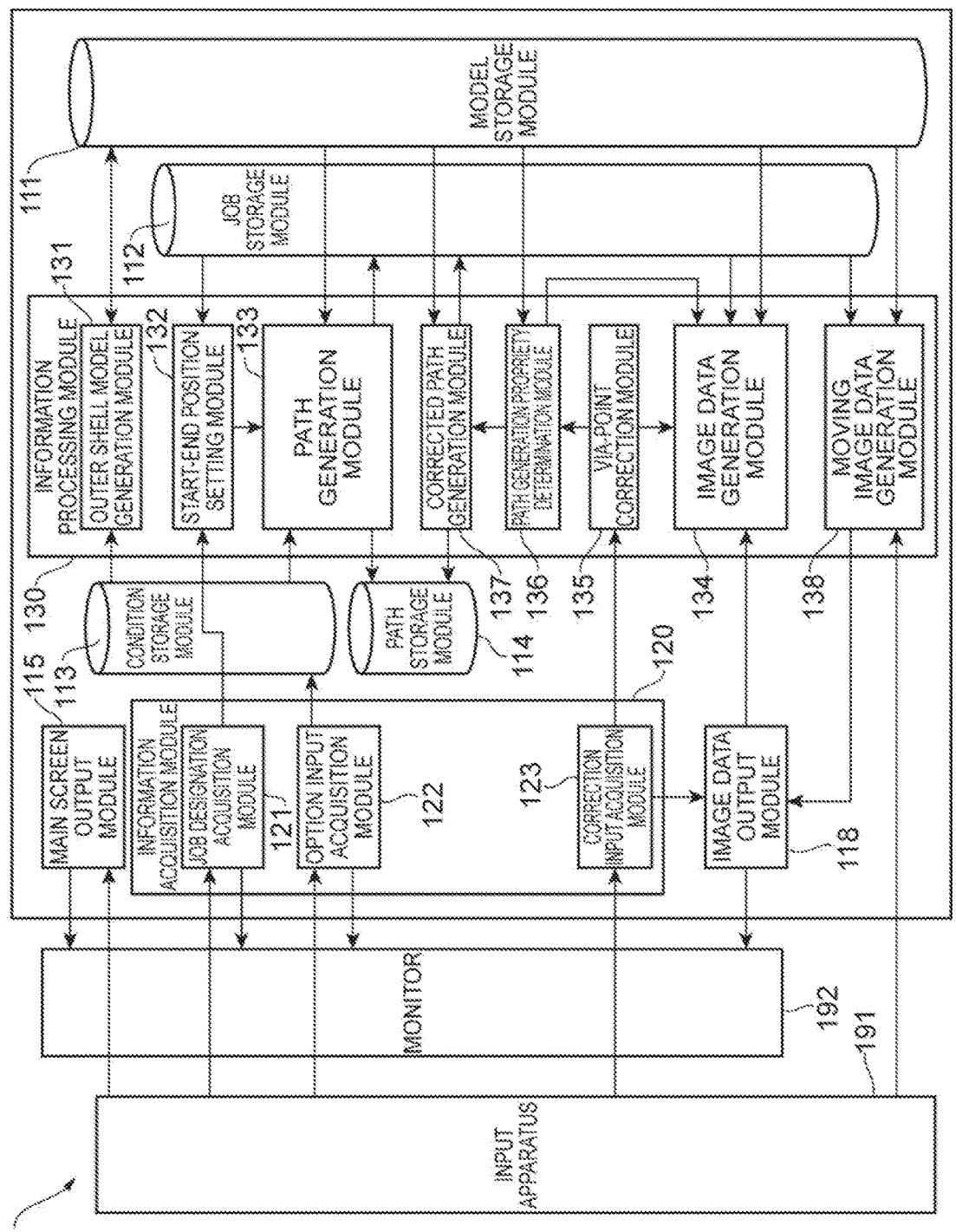
FIG. 2 is a block diagram illustrating a functional configuration of a robot simulator.

Subsequently, a configuration of the robot simulator 100 will be described in detail. As illustrated in FIG. 2, the robot simulator 100 includes one or more computers, an input apparatus 191, and a monitor 192. In some example embodiments, the robot simulator 100 may comprise a main body, such as the main body 110 illustrated in FIG. 5, operably coupled to the input apparatus 191 and the monitor 192.

Figure 5:
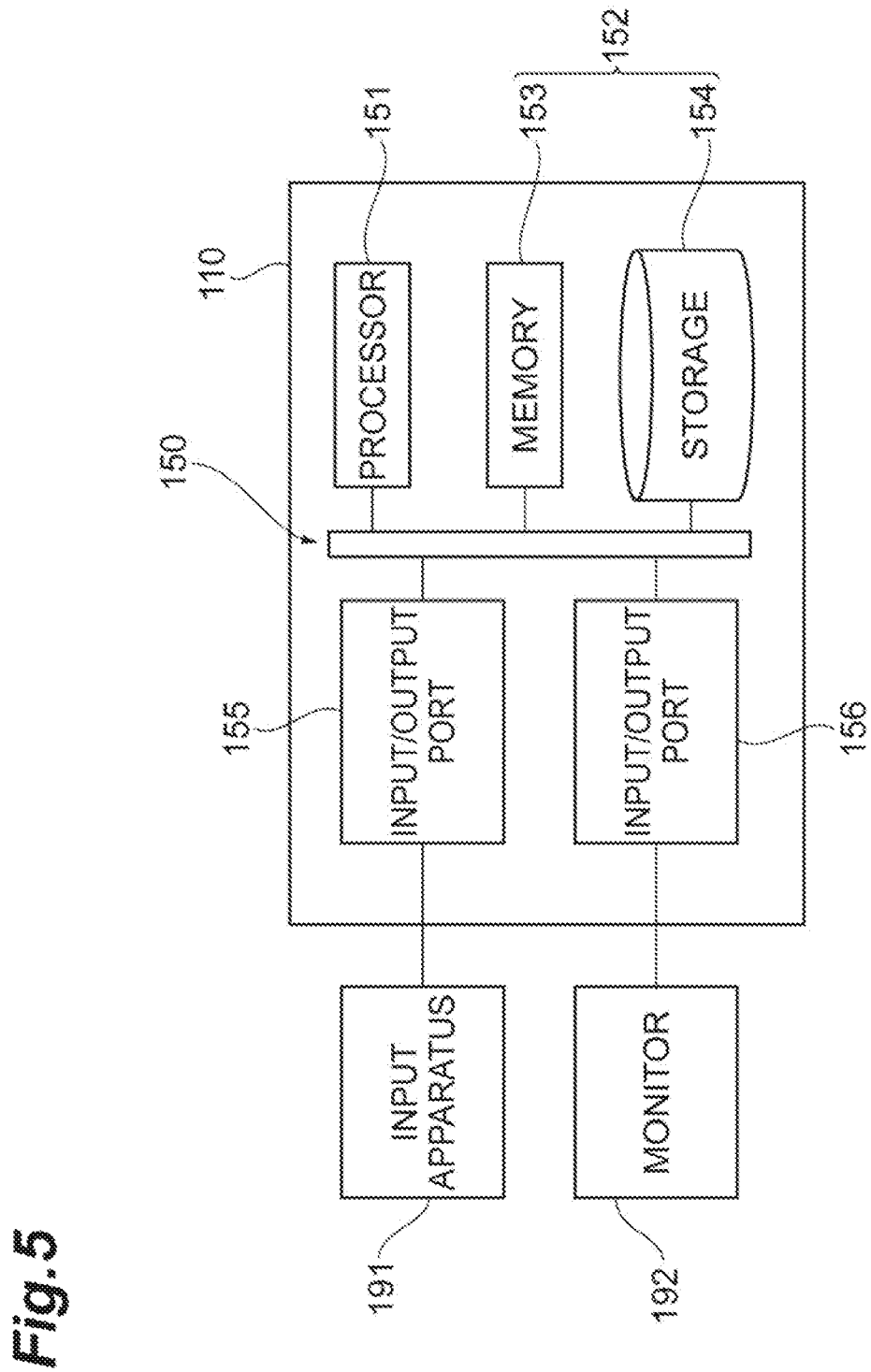
FIG. 5 is a block diagram illustrating a hardware configuration of the robot simulator.

The input apparatus 191 is an apparatus used for inputting information into the robot simulator 100. The input apparatus 191 may be of any type as long as desired information can be input on the apparatus, and specific examples thereof include a keypad and a mouse. The monitor 192 is an apparatus used for displaying information output from the robot simulator 100. The monitor 192 may be of any type as long as graphic display is possible on the monitor, and a specific example thereof is a liquid crystal panel. Note that the input apparatus 191 and the monitor 192 may be integrated as a touchscreen having both an input function and a display function. Moreover, the input apparatus 191 and the monitor 192 may be incorporated in the main body 110 (FIG. 5).

In some example embodiments, the robot simulator 100 includes as a functional configuration (hereinafter referred to as "functional modules") a model storage module 111, a job storage module 112, a condition storage module 113, a path storage module 114, a main screen output module 115, an information acquisition module 120, an information processing module 130, and an image data output module 118. However, in other example embodiments one or more of the illustrated modules may comprise hardware or electronic devices as further described below at FIG. 5. For example, one or more of the storage modules may comprise a data storage device or data storage medium, and various other modules may comprise processing devices. Additionally, one or more of the acquisition or receiving modules may comprise a processor, a sensor, a camera, a microphone, a laser, a graphic user interface, a pointing device, a mouse, other types of processing devices, data acquisition devices, data receiving devices, and data input devices, or any combination thereof.

The model storage module 111 stores model information related to the robot 10 and an obstacle in the vicinity of the robot 10. For example, the model storage module 111 stores model information of the workpiece 30 as the model information related to the obstacle. The model information is three-dimensional surface data constituted with polygons, for example. The model information of the robot 10 and the workpiece 30 may be generated based on three-dimensional design data or may be generated based on measurement data by a three-dimensional measurement apparatus, or the like.

The job storage module 112 stores at least one job that defines operation of the robot 10. As illustrated in FIG. 3, each of the jobs includes a plurality of lines arranged in chronological order. Each of the lines includes information defining a target position and posture of the distal end portion 16 and the necessity of generating a path with the preceding line. Paths obtained by methods such as linear interpolation, circular interpolation, and joint angle interpolation are set beforehand between sequentially arranged lines (hereinafter referred to as "sections"). Hereinafter, this will be referred to as an "initial path".

Returning to FIG. 2, the condition storage module 113 stores path generation conditions. For example, the condition storage module 113 stores a condition (hereinafter referred to as a "repetition condition") for regulating the number of times of generation of a path (hereinafter referred to as a "generated path"). The repetition condition may be an upper limit value of the number of times of path generation, or may be the amount of time for repeating path generation.

The condition storage module 113 may further store an evaluation criterion for the generated path. The evaluation criterion for the path is used as a criterion for selecting which one of the plurality of generated paths satisfy the above-described repetition condition. Specific examples of the evaluation criterion of the path include: a determination of the one path of the plurality of generated paths that is associated with the quickest path or the shortest duration of time for moving the distal end portion 16 from the start position to the end position; a determination of one or more movements of the distal end portion 16 in which the total operation angle of the joints J1 to J6 during the movement of the distal end portion 16 along the path is associated with the smallest total operation angle; a determination of the one path of the plurality of generated paths that is associated with the fewest number of via-points (described below); and an evaluation of the power consumption of the actuators 21 to 26 to determine one or more movements of the distal end portion 16 along the path that are associated with the least amount of power consumption.

The condition storage module 113 may also store an accessible distance of the obstacle to the robot 10, that is, the accessible distance of the robot 10 to the obstacle. The accessible distance is used in the generation of an outer shell model described below.

The condition storage module 113 may store a posture condition of the distal end portion 16 in the movement along the path. The posture condition may be a numerical value defining a unique posture angle of the distal end portion 16, or may be a numerical value range defining an upper limit value and a lower limit value of the posture angle of the distal end portion 16.

The condition storage module 113 may store a movable range of the joints J1 to J6 in the movement of the distal end portion 16 along the path. The movable range of the joints J1 to J6 may be determined in any form. For example, each of the movable range of the joints J1 to J6 may be a numerical value range of each of the angles of the joints J1 to J6, or may be a ratio to a movable range defined by hardware constraints (hereinafter referred to as a "structural movable range").

The path storage module 114 stores a generated path.

Figure 4:
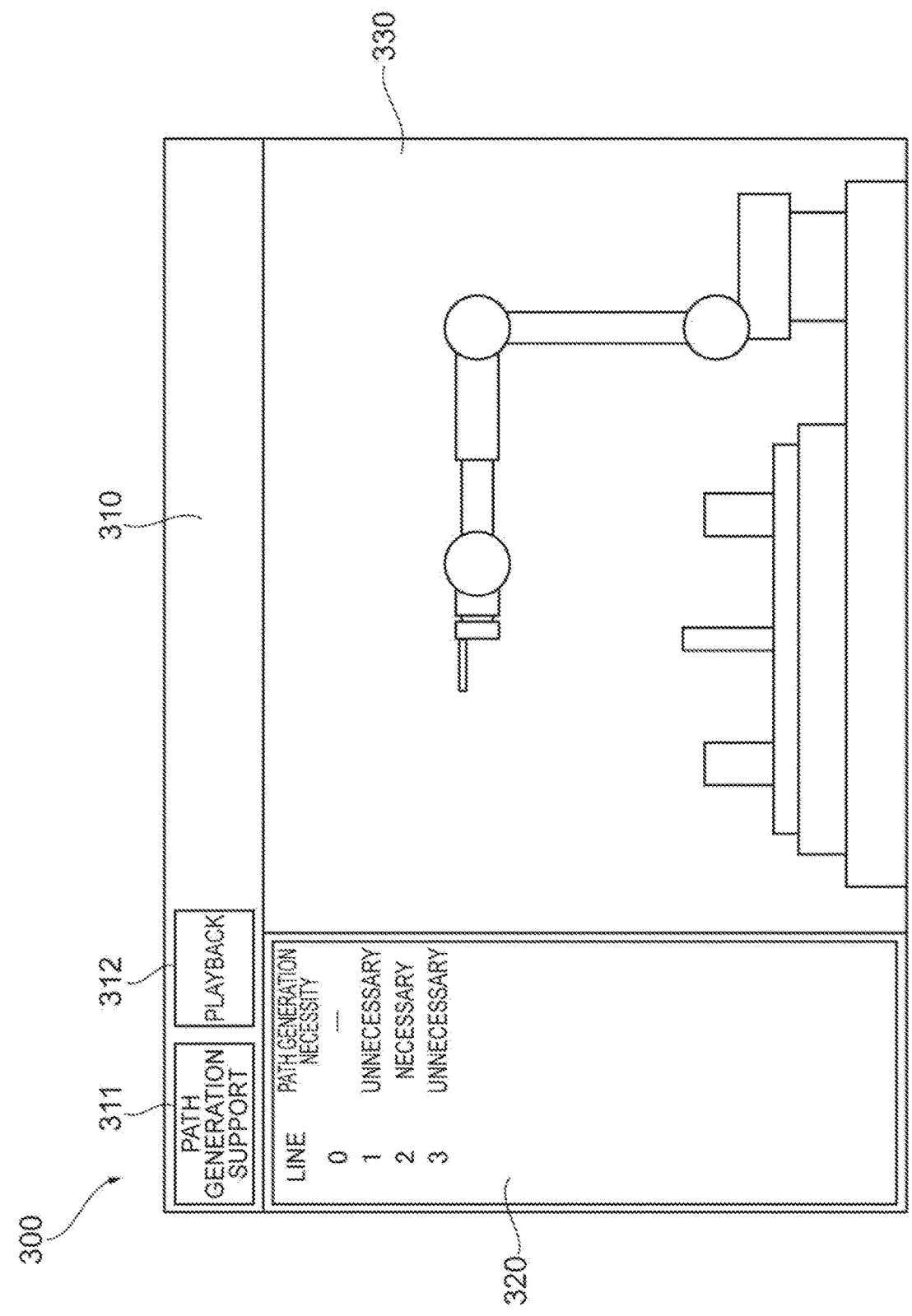
FIG. 4 is a schematic diagram illustrating a main window.

The main screen output module 115 generates main window data for operating the robot simulator 100 and outputs the generated data to the monitor 192. FIG. 4 is a schematic diagram illustrating a main window. As illustrated in FIG. 4, a main window 300 includes a menu bar 310, a job frame 320, and a drawing frame 330. The menu bar 310 includes buttons for invoking various functions of the robot simulator 100. For example, the menu bar 310 includes a path generation support button 311 and a playback button 312. The path generation support button 311 is a button for invoking a path generation support function and enables operation input (for example, clicking or tapping) by the input apparatus 191. The playback button 312 is a button used for the playback of a moving image of the robot 10 according to a generated path, and enables operation input by the input apparatus 191. The job frame 320 displays a configuration of the job to be a path generation support target. The drawing frame 330 displays an image including an illustration of the robot 10 and an illustration of the workpiece 30.

Returning to FIG. 2, the information acquisition module 120 is configured to obtain at least input information (hereinafter referred to as "first input information") defining a start position and an end position of the operation of the robot 10. The "start position" includes a position of the distal end portion 16 at the start of the operation and the posture of the robot 10 (that is, the angles of the joints J1 to J6) when the distal end portion 16 is arranged at the position. The "end position" includes a position of the distal end portion 16 at the end of operation and the posture of the robot 10 when the distal end portion 16 is arranged at the position.

The information acquisition module 120 may be configured to further obtain input information (hereinafter referred to as "second input information" or "relocation input information") for changing the position of a via-point (described below) of the generated path.

The information acquisition module 120 may be configured to further obtain at least one of input information (hereinafter referred to as "third input information" or "regulating input information") defining the above-described repetition conditions, input information (hereinafter referred to as "fourth input information" or "evaluation input information") defining the evaluation criterion of the path, input information (hereinafter referred to as "fifth input information" or "accessibility input information") defining the above-described accessible distance, input information (hereinafter referred to as "sixth input information" or "posture input information") defining the above-described posture condition, and input information (hereinafter referred to as "seventh input information" or "range input information") defining the above-described movable range.

For example, the information acquisition module 120 includes as subdivided functional modules, a job specification acquisition module 121, an option input acquisition module 122, and a correction input acquisition module 123.

As an example of the above-described first input information, the job specification acquisition module 121 obtains information (hereinafter referred to as "job specifying information") specifying any of the jobs stored in the job storage module 112 from the input apparatus 191. As described above, the job includes a plurality of lines sequentially arranged in chronological order, and each of the lines includes information defining the target position and the posture of the distal end portion 16. Accordingly, specifying a job determines the start position and the end position of the operation of the robot 10 for each of the sections of the job. Note that the first input information is not limited to the job specifying information. The job specification acquisition module 121 may obtain from the input apparatus 191 information directly specifying the start position and the end position.

The option input acquisition module 122 obtains the above-described third input information to the seventh input information from the input apparatus 191 and writes the conditions determined by the obtained input information into the condition storage module 113.

The correction input acquisition module 123 obtains from the input apparatus 191 input information for moving an index of a via-point (described below) on the image of the monitor 192 as an example of the above-described second input information.

The information processing module 130 is configured to execute generation of a path for moving the distal end portion 16 from the start position to the end position while avoiding a collision between the robot 10 and the obstacle based on the first input information and the model information and execute generation of image data including an illustration of the obstacle and an index indicating the via-point of the path.

The information processing module 130 may be configured to execute correction of the path so as to pass through the via-point after a position change based on the above-described second input information and execute generation of image data in which the position of the index has been changed based on the second input information.

The information processing module 130 may be configured, in generation of a path, to execute repetition of generation of the path until the above-described repetition condition defined by the third input information is satisfied and execute selection of one path from among the plurality of generated paths. The information processing module 130 may be configured to select the one path in accordance with the above-described evaluation criterion defined by the fourth input information when selecting the one path from among the plurality of paths.

The information processing module 130 may be configured to further execute generation of an outer shell model covering the robot 10 while maintaining the above-described accessible distance defined based on the fifth input information, and generate a path for moving the distal end portion 16 from the start position to the end position while avoiding a collision between the outer shell model and the obstacle in generation of the path.

The information processing module 130 may be configured to generate an outer shell model covering the obstacle while maintaining the above-described accessible distance in addition to the outer shell model covering the robot 10 and may be configured to generate a path for moving the distal end portion 16 from the start position to the end position while avoiding a collision between the outer shell model of the robot 10 and the outer shell model of the obstacle.

In generation of a path, the information processing module 130 may be configured to generate the path such that the posture of the distal end portion 16 satisfies the above-described posture condition defined by the sixth input information, and may be configured to generate the path such that the operation angles of the joints J1 to J6 are within movable ranges defined by the seventh input information.

For example, the information processing module 130 includes as subdivided functional modules, an outer shell model generation module 131, a start-end position setting module 132, a path generation module 133, an image data generation module 134, a via-point correction module 135, a path generation propriety determination module 136, a corrected path generation module 137, and a moving image data generation module 138.

The outer shell model generation module 131 generates an outer shell model covering the robot 10 while maintaining the above-described accessible distance stored in the condition storage module 113 and writes the generated model into the model storage module 111. The outer shell model generation module 131 may further generate an outer shell model covering obstacles (for example, components 32, 33, and 34) while maintaining the above-described accessible distance and may write the generated model into the model storage module 111.

The start-end position setting module 132 obtains information of a job (hereinafter referred to as "specified job") corresponding to the specification obtained by the job specification acquisition module 121 from the job storage module 112 and defines a start position and an end position of the section as a path generation target based on the information.

The path generation module 133 obtains information of the start position and the end position of the section as a target of path generation from the start-end position setting module 132, and then obtains the model information from the model storage module 111, so as to generate a path for moving the distal end portion 16 from the start position to the end position while avoiding the collision between the robot 10 and the obstacle. The path generation module 133 may be configured to generate a corrected path by generating the via-point satisfying a first condition set so that no collision occurs between the robot 10 and the obstacle, and satisfying a second condition set so that a proposed posture of the distal end portion of the robot 10 complies with the maximum allowable joint angles associated with a plurality of joints of the robot 10. Additionally, the path generation module 133 may be configured to repeat the operation of correcting the path by generating a plurality of via-points so as to set the path to pass through the plurality of via-points until the first condition and the second condition are satisfied over the entire path.

More specifically, the path generation module 133 generates a path from the start position to the end position via at least one via-point so as to satisfy the following conditions i) to iii). Portions between the start position and the via-point, between the individual via-points, and between the via-point and the end position are interpolated by methods such as linear interpolation, circular interpolation, and joint angle interpolation.

i) No collision (interference) occurs between the outer shell model of the robot 10 and the model of the obstacle stored in the model storage module 111.

ii) The posture of the distal end portion 16 in the movement along the path satisfies the above-described posture condition stored in the condition storage module 113.

iii) In the movement of the distal end portion 16 along the path, the operation angles of the joints J1 to J6 are within the movable ranges stored in the condition storage module 113.

The path generation module 133 repeats generation of the path until the above-described repetition conditions stored in the condition storage module 113 are satisfied and obtains a plurality of paths, and thereafter, the path generation module 133 selects one path from among the plurality of paths in accordance with the above-described evaluation criterion stored in the condition storage module 113 and applies the selected path to the specified job stored in the job storage module 112. As a result, the above-described initial path in the path generation target section among the specified jobs is modified to a path that satisfies the above-described conditions i) to iii).

After generating the path, the path generation module 133 corrects the path so as to pass through the via-point after a position change based on the second input information.

Based on the model information stored in the model storage module 111 and the modified job stored in the job storage module 112 (the job after path modification by the path generation module 133), the image data generation module 134 generates image data including an illustration of the robot 10, an illustration of the workpiece 30, an index indicating a via-point of the path, and a line indicating the path. The image data may be, for example, three-dimensional image data constituted with polygons and vectors, or two-dimensional diagrammatic data. After generating the above-described image data, the image data generation module 134 generates image data in which the position of the above-described index has been changed based on the second input information.

The via-point correction module 135 changes the position of the via-point in the three-dimensional space in accordance with the position change of the above-described index.

The path generation propriety determination module 136 determines whether it is possible to generate a path that passes through the changed via-point. For example, the path generation propriety determination module 136 determines whether the changed via-point satisfies the above-described conditions i) to iii).

The corrected path generation module 137 corrects the path so as to pass through the above-described changed via-point and applies the corrected path to the above-described modified job stored in the job storage module 112.

Based on the model information stored in the model storage module 111 and the modified job stored in the job storage module 112, the moving image data generation module 138 generates moving image data in a case where the robot 10 is operated so as to move the distal end portion 16 along the path.

The image data output module 118 outputs the image data generated by the image data generation module 134 or the moving image data generated by the moving image data generation module 138 to the monitor 192.

FIG. 5 is a block diagram illustrating an example hardware configuration of the main body 110. As illustrated in FIG. 5, the main body 110 includes a circuit 150, and the circuit 150 includes one or more processing devices or processors 151, a storage device or storage module 152, and input/output ports 155 and 156.

The storage module 152 includes a memory 153 and a storage 154. The storage 154 records programs used to configure each of the above-described functional modules of the main body 110. The storage 154 may be of any type as long as it is a computer-readable storage. Specific examples include a hard disk, a nonvolatile semiconductor memory, a magnetic disk, and an optical disk. The memory 153 temporarily stores the program loaded from the storage 154, calculation results of the processor 151, or the like. The processor 151 executes programs in cooperation with the memory 153, thereby constituting each of the functional modules.

The input/output port 155 inputs and outputs electric signals to/from the input apparatus 191 in accordance with a command from the processor 151. The input/output port 156 inputs and outputs an electric signal to/from the monitor 192 in accordance with a command from the processor 151. The input apparatus 191 may comprise a sensor, a camera, a microphone, a laser, a graphic user interface, a pointing device, a mouse, other types of data input devices, data receiving devices, and data acquisition devices, or any combination thereof.

[Simulation Method]

Subsequently, a path generation support procedure by the robot simulator 100 will be described as an exemplary simulation method.

(Procedure from Invocation of Path Generation Support Function to Path Generation)

Figure 6:
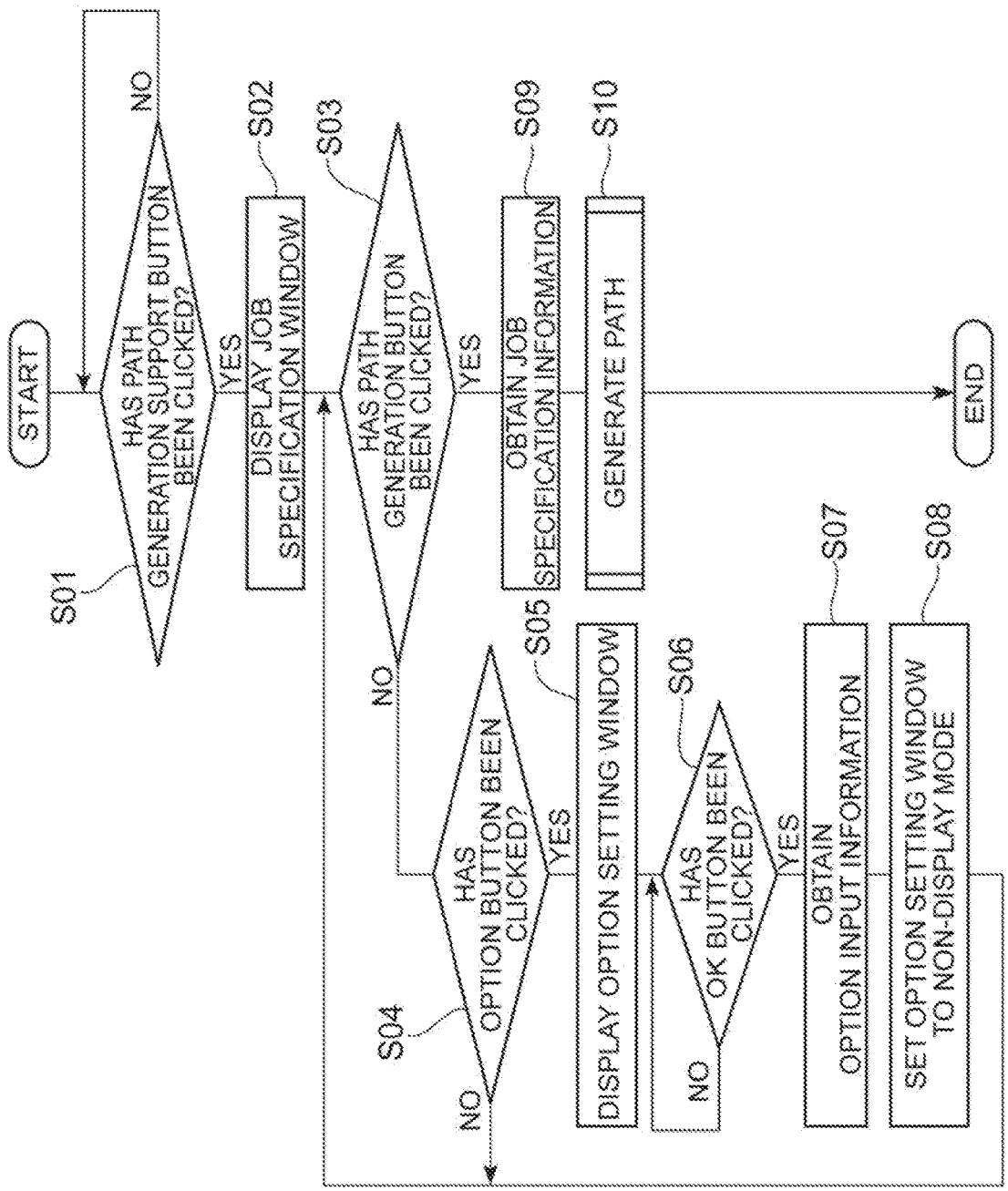
FIG. 6 is a flowchart illustrating a procedure from invocation of a path generation support function to path generation.

As illustrated in FIG. 6, the robot simulator 100 first executes step S01. In step S01, the main screen output module 115 waits for an operation input to the path generation support button 311.

Next, the robot simulator 100 executes step S02. In step S02, the job specification acquisition module 121 outputs data for displaying the job specifying window to the monitor 192.

Figure 7:
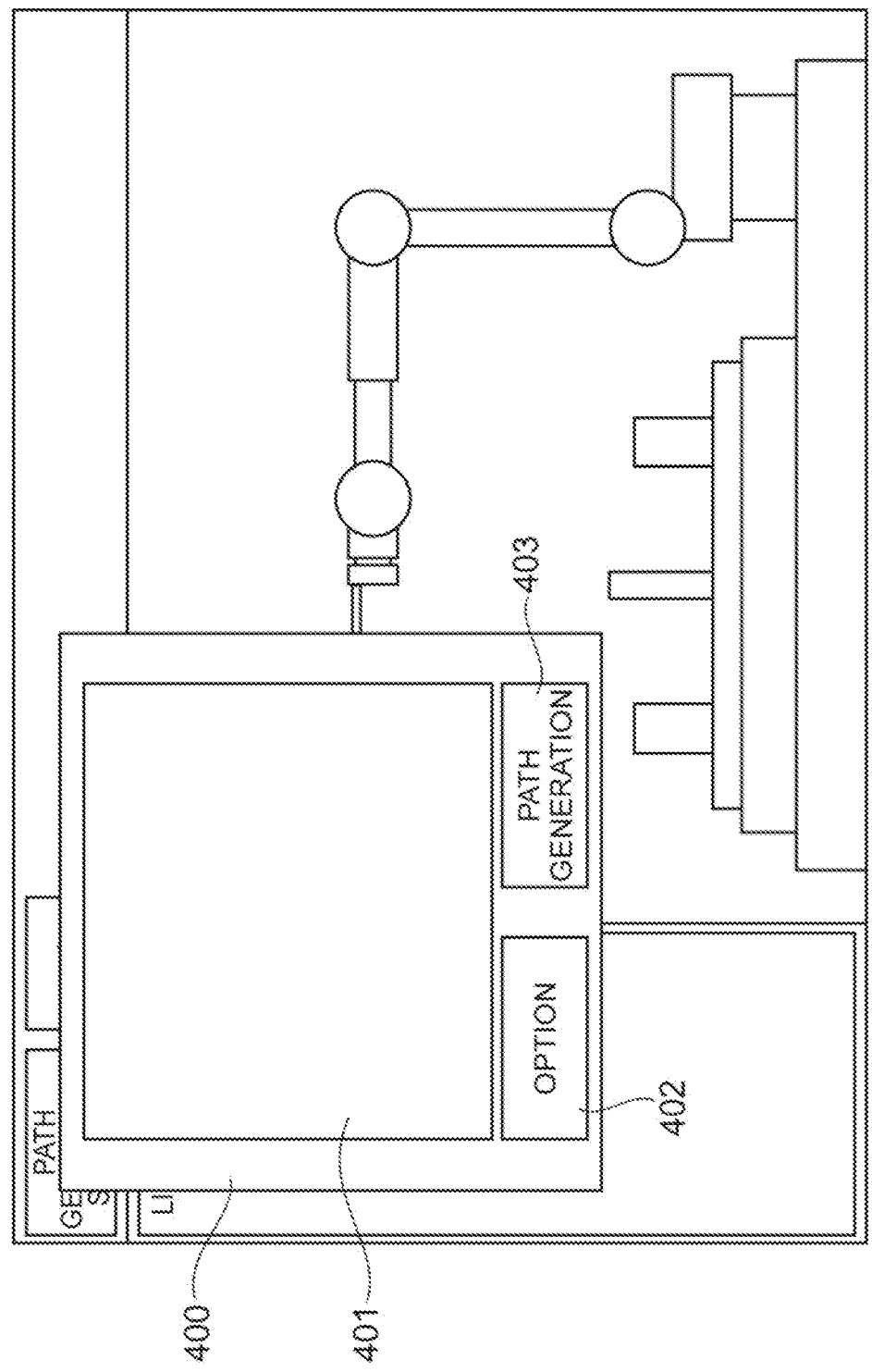
FIG. 7 is a schematic diagram illustrating a screen displaying a job specifying window.

FIG. 7 is a schematic diagram illustrating a screen displaying a job specifying window. As illustrated in FIG. 7, the job specifying window 400 includes a job list 401, an option button 402, and a path generation button 403. The job list 401 displays a list of jobs stored in the job storage module 112. By inputting into the input apparatus 191, it is possible to select any of the jobs displayed in the job list 401. The option button 402 is a button for invoking an input screen of an optional condition for path generation and enables operation input by the input apparatus 191. The path generation button 403 is a button for requesting execution of path generation for one job selected in the job list 401 and enables operation input by the input apparatus 191.

Returning to FIG. 6, the robot simulator 100 then executes step S03. In step S03, the job specification acquisition module 121 confirms the presence or absence of an operation input to the path generation button 403.

In a case where it is determined in step S03 that there is no operation input to the path generation button 403, the robot simulator 100 executes step S04. In step S04, the option input acquisition module 122 confirms the presence or absence of an operation input to the option button 402.

In a case where it is determined in step S04 that there is no operation input to the option button 402, the robot simulator 100 returns the processing to step S03. Thereafter, the robot simulator 100 waits for an operation input to any of the option button 402 and the path generation button 403.

In a case where it is determined in step S04 that there is an operation input to the option button 402, the robot simulator 100 executes step S05. In step S05, the option input acquisition module 122 displays the option setting window.

Figure 8:
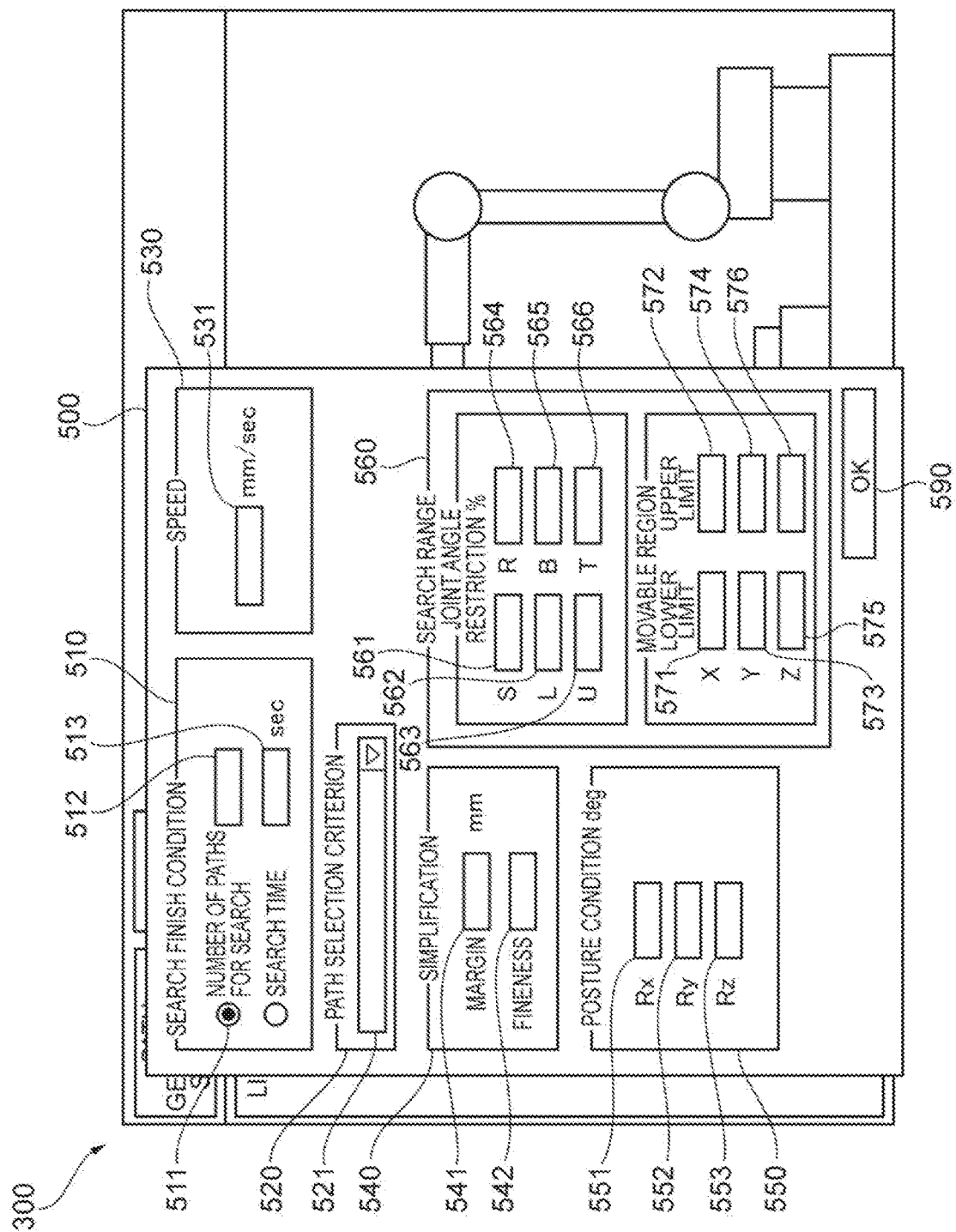
FIG. 8 is a schematic diagram illustrating a screen displaying an option setting window.

FIG. 8 is a schematic diagram illustrating a screen displaying the option setting window. As illustrated in FIG. 8, an option setting window 500 includes setting menus 510, 520, 530, 540, 550, and 560, and an OK button 590.

The setting menu 510 is a menu for setting the path search finish condition (the above-described repetition condition), and includes input boxes 512 and 513 and a radio button 511. The input box 512 is a portion for inputting the number of search paths (the above-described repetition number) and enables an input of numerical value by the input apparatus 191. The input box 513 is a portion for inputting the search time (the above-described repetition time), and enables an input of a numerical value by the input apparatus 191. The radio button 511 is a portion for selecting which of the number of search paths and the search time is to be determined and enables selection input by the input apparatus 191. The input information to the setting menu 510 corresponds to an example of the above-described third input information.

The setting menu 520 is a menu for setting path selection criterion (the above-described evaluation criterion) and includes an input box 521. The input box 521 is a portion for inputting selection criterion, and enables selection input by the input apparatus 191. For example, the input box 521 is configured to enable inputting any of "minimum cycle time", "minimum joint operation angle", "minimum number of via-points" or "minimum power consumption" by a pull-down system. In a case where "minimum cycle time" is input in the input box 521, the above-described evaluation criterion is set so as to select a path achieving a minimum time for movement of the distal end portion 16 along the path. In a case where "minimum joint operation angle" is input in the input box 521, the above-described evaluation criterion is set so as to select a path achieving a minimum total operating angle of the joints J1 to J6 in the movement of the distal end portion 16 along the path. In a case where the "minimum number of via-points" is input in the input box 521, the above-described evaluation criterion is set so as to select the path achieving the minimum number of via-points (described below) of the path. In a case where the "minimum power consumption" is input in the input box 521, the evaluation criterion is set so as to select the path achieving the minimum power consumption of the actuators 21 to 26 in a movement of the distal end portion 16 along the path. The input information to the setting menu 520 corresponds to an example of the above-described fourth input information.

The setting menu 530 is a menu for setting the moving speed of the distal end portion 16 in a generated path and includes an input box 531. The input box 531 is a portion for inputting a setting value of the moving speed, and enables an input of a numerical value by the input apparatus 191.

The setting menu 540 is a menu for setting simplification conditions (generation conditions of the above-described outer shell model) and includes input boxes 541 and 542. The input box 541 is a portion of the menu for inputting a margin amount (the above-described accessible distance) and enables an input of a numerical value by the input apparatus 191. The input box 542 is a portion of the menu for inputting the level of detail and enables an input of a numerical value (hereinafter referred to as "eighth input information" or "complexity input information") by the input apparatus 191. The level of detail represents the degree of simplification or the degree of complexity of the outer shell model. Specific examples of the level of detail include a numerical value indicating the degree of subdivision of the surface of the outer shell model. The numerical value indicating the degree of subdivision may be represented by the ratio to the surface of the model of the robot 10. The input information to the input box 541 corresponds to the above-described fifth input information.

The setting menu 550 is a menu for setting the above-described posture condition and includes input boxes 551, 552, and 553. The input boxes 551, 552, and 553 are portions of the menu for inputting a tilt angle around the X-axis, a tilt angle around the Y-axis, and a tilt angle around the Z-axis, respectively, and each of the boxes enables an input of a numerical value by the input apparatus 191. The X-, Y-, and Z-axes are predetermined coordinate axes. The input information to the setting menu 550 corresponds to the above-described sixth input information.

The setting menu 560 is a menu for setting conditions for regulating a path search range (spatial search range), and includes input boxes 561, 562, 563, 564, 565, and 566, and input boxes 571, 572, 573, 574, 575, and 576.

Input boxes 561, 562, 563, 564, 565 and 566 are portions of the menu for inputting values defining the movable ranges of the joints J1 to J6, and each of the boxes enables an input of a numerical value by the input apparatus 191. For example, it is possible to input usage rates for the structural movable ranges of the joints J1 to J6 in the input boxes 561 to 566, respectively. In this case, ranges obtained by multiplying the structural movable ranges of the joints J1 to J6 by the above-described usage rates are individually set as the above-described movable ranges.

The input boxes 571, 572, 573, 574, 575, and 576 are portions of the menu for inputting values defining a movable region of the distal end portion 16, and each of the boxes enables an input of a numerical value by the input apparatus 191. For example, the input boxes 571 and 572 enable an input of each of a lower limit and an upper limit of the X-axis coordinate, respectively, the input boxes 573 and 574 enable an input of each of a lower limit and an upper limit of the Y-axis coordinate, respectively, and the input boxes 575 and 576 enable an input of each of a lower limit and an upper limit of the Z-axis coordinate, respectively. The region defined by these input values is set as the movable region of the distal end portion 16.

The input information to the input boxes 561 to 566 corresponds to the above-described seventh input information. The input information to the input boxes 571 to 576 also corresponds to the above-described seventh input information. The reason is that regulating the movable region of the distal end portion 16 indirectly regulates the movable ranges of the joints J1 to J6.

The OK button 590 is a button for requesting registration of the content of input to the setting menus 510, 520, 530, 540, 550, and 560, and enables an operation input by the input apparatus 191.

Returning to FIG. 6, the robot simulator 100 then executes step S06. In step S06, the option input acquisition module 122 waits for an operation input to the OK button 590.

Next, the robot simulator 100 executes step S07. In step S07, the option input acquisition module 122 obtains input information for the setting menus 510, 520, 530, 540, 550, and 560 and writes the obtained information into the condition storage module 113 as path generation conditions.

Next, the robot simulator 100 executes step S08. In step S08, the option input acquisition module 122 outputs a command to set the option setting window 500 to a non-display mode to the monitor 192.

In a case where it is determined in step S03 that there is an operation input to the path generation button 403, the robot simulator 100 executes step S09. In step S09, the job specification acquisition module 121 obtains a job selection status in the job list 401 as the above-described job specifying information.

Next, the robot simulator 100 executes step S10. In step S10, the information processing module 130 generates a path for the section, in accordance with the condition(s) stored in the condition storage module 113, as a path generation target among the sections of the specified jobs (jobs specified by the job specifying information). Details of the processing content in step S10 will be described below.

This completes the procedure from invocation of the path generation support function to path generation.

(Detailed Procedure of Path Generation)

Figure 9:
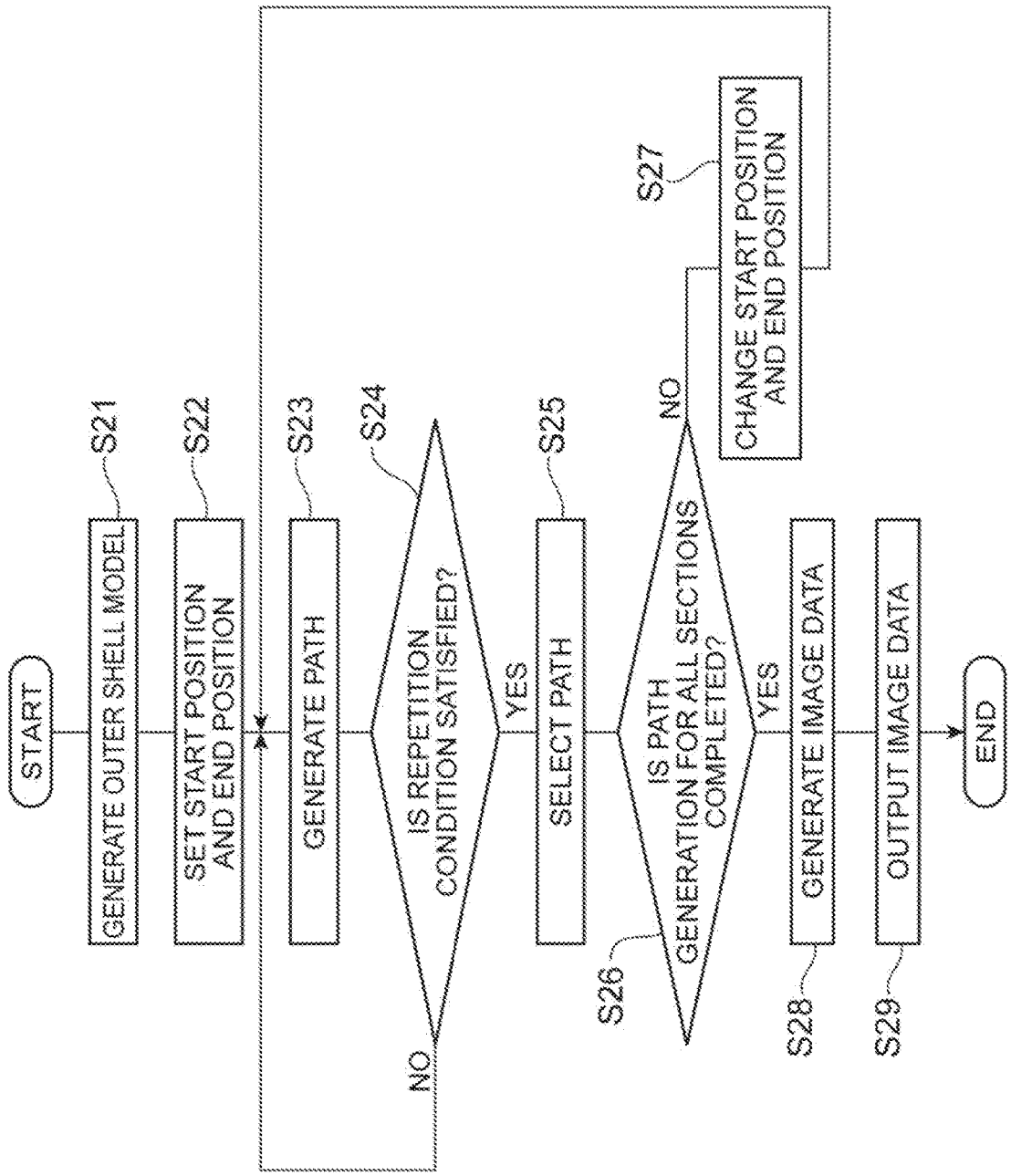
FIG. 9 is a flowchart illustrating a detailed procedure of path generation.

Subsequently, a detailed procedure of the processing in step S10 will be described. As illustrated in FIG. 9, the robot simulator 100 first executes step S21. In step S21, the outer shell model generation module 131 generates an outer shell model covering the robot 10 while maintaining the above-described accessible distance stored in the condition storage module 113, and writes the generated model into the model storage module 111. For example, the outer shell model generation module 131 generates the outer shell model in accordance with the above-described level of detail such that the minimum value of the interval between the model of the robot 10 and the outer shell model is equal to or greater than the above-described accessible distance.

Next, the robot simulator 100 executes step S22. In step S22, the start-end position setting module 132 obtains the information related to the above-described specified job from the job storage module 112, and determines the start position and the end position of the section as a path generation target based on the obtained information.

Next, the robot simulator 100 executes step S23. In step S23, the path generation module 133 obtains the information related to the start position and the end position from the start-end position setting module 132, and obtains model information from the model storage module 111. The path generation module 133 then generates a path for moving the distal end portion 16 from the start position to the end position while avoiding a collision between the robot 10 and the obstacle, and writes the generated path into the job storage module 112 as a "candidate path". More specifically, the path generation module 133 generates the path to satisfy the above-described conditions i) to iii). For example, the path generation module 133 generates a via-point that satisfies the above-described conditions i) to iii), and repeats path correction over the entire path so as to set the path to pass through the via-point until the conditions i) to iii) are satisfied. Another method of generating via-points is disclosed in Japanese Patent No. 4103057, the entire contents of which are incorporated by reference.

Next, the robot simulator 100 executes step S24. In step S24, the path generation module 133 confirms whether the above-described repetition condition stored in the condition storage module 113 is satisfied.

In a case where it is determined in step S24, that the above-described repetition condition is not satisfied, the robot simulator 100 returns the processing to step S23. Thereafter, generation and writing of the candidate path are repeated until the above-described repetition condition is satisfied, accumulating a plurality of candidate paths in the path storage module 114.

Next, the robot simulator 100 executes step S25. In step S25, the path generation module 133 selects one path from among the above-described plurality of candidate paths in accordance with the above-described evaluation criterion stored in the condition storage module 113, and applies the selected path to the specified job stored in the job storage module 112. That is, the via-point of the relevant path is inserted into the section as the path generation target among the specified jobs. As a result, the above-described initial path in the section is modified to the path that satisfies the above-described conditions i) to iii).

Next, the robot simulator 100 executes step S26. In step S26, the start-end position setting module 132 confirms whether path generation is completed for all the sections as path generation targets.

In a case where it is determined in step S26 that there is a remaining section as a target of path generation, the robot simulator 100 executes step S27. In step S27, the start-end position setting module 132 selects any of the sections as a target of path generation, and changes the start position and the end position accordingly. Thereafter, the robot simulator 100 returns the processing to step S23. Thereafter, path generation and modification of the specified job according to the generated path are repeated until path generation is completed for all the sections as path generation targets. Accordingly, hereinafter, the specified job with the modified initial path will be referred to as a "modified job" for all the sections as path generation targets.

In a case where it is determined in step S26 that there is no remaining section as a target of path generation, the robot simulator 100 executes step S28. In step S28, based on the model information stored in the model storage module 111 and the modified job stored in the job storage module 112, the image data generation module 134 generates image data including an illustration of the robot 10, an illustration of the outer shell model, an illustration of the workpiece 30, an index indicating a via-point of the path, and a line indicating the path.

Next, the robot simulator 100 executes step S29. In step S29, the image data output module 118 obtains the image data generated in step S29 from the image data generation module 134, and outputs the obtained image data to the monitor 192. This completes the above-described step S10.

Figure 10:
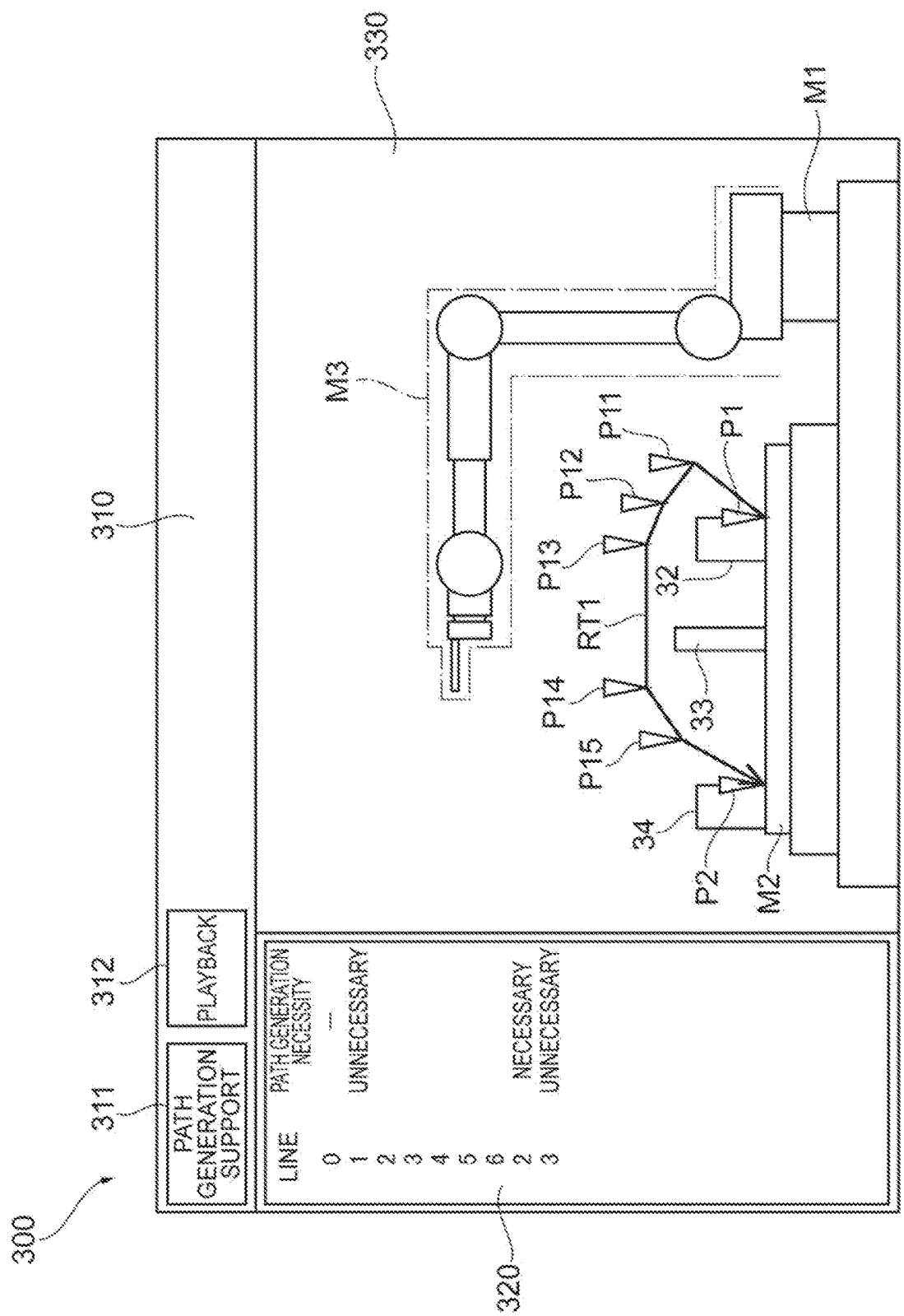
FIG. 10 is a schematic diagram illustrating a screen displaying generated paths.

FIG. 10 is a schematic diagram illustrating an image displayed on the monitor 192 in step S29. The drawing frame 330 displays an outer shell model M3 in addition to a model M1 of the robot 10 and a model M2 of the workpiece 30. Furthermore, the drawing frame 330 displays an index P1 indicating a start position, indices P11 to P15 indicating via-points, an index P2 indicating an end position, and a line RT1 starting from the index P1 of the starting position to the index P2 of the end position through the indices P11 to P15 of the via-points. In a state where the indices P11 to P15 are displayed, any of the indices P11 to P15 can be selected as an input by the input apparatus 191. While FIG. 10 two-dimensionally displays the display content in the drawing frame 330 for ease of understanding, in some example embodiments a three-dimensional image may be displayed in the drawing frame 330.

Figure 11:
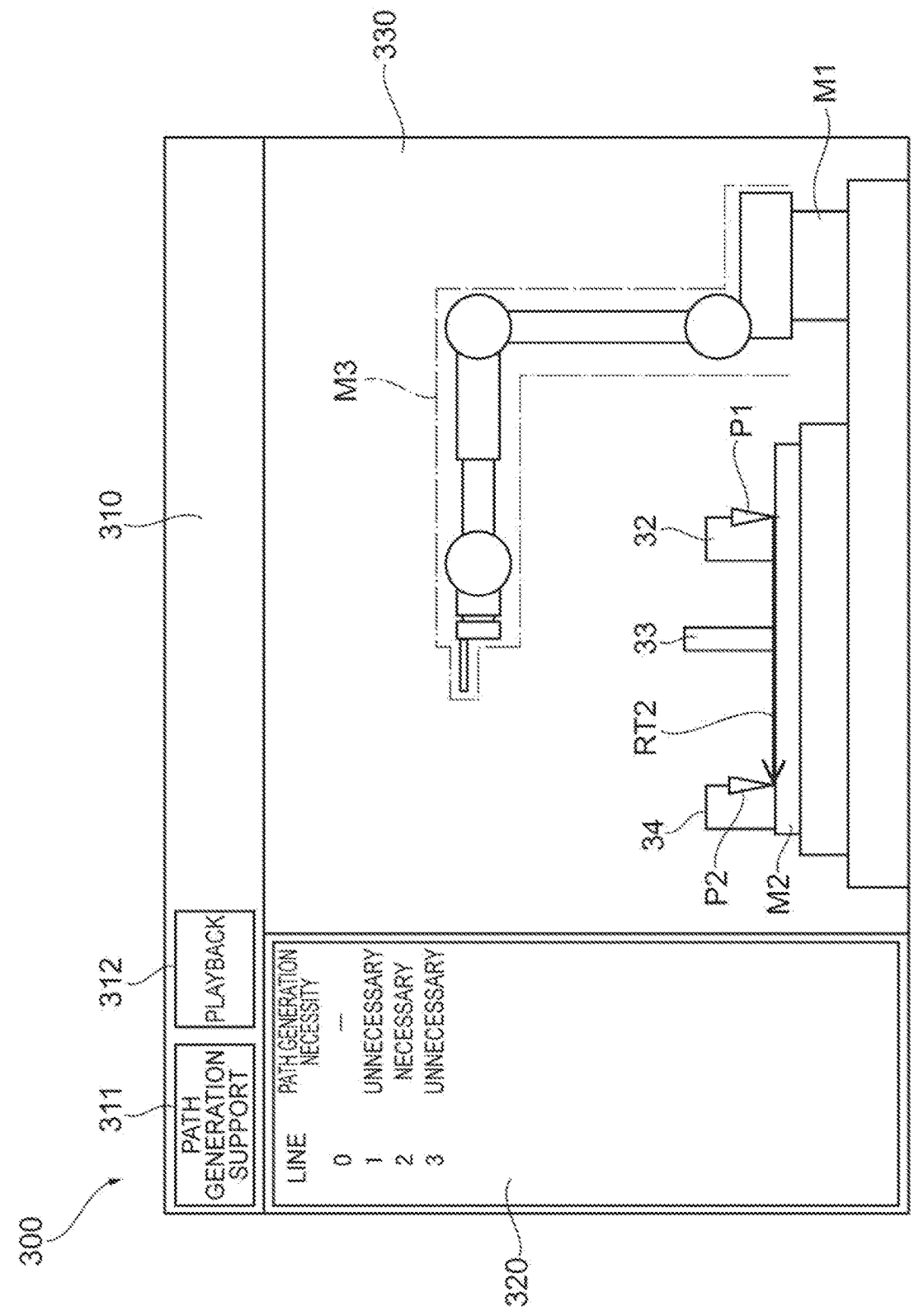
FIG. 11 is a schematic diagram illustrating a screen displaying a path connecting a start position and an end position by a straight line.

FIG. 11 is a diagram for comparison, illustrating an image displaying the above-described initial path without performing the above-described steps S23 to S27. FIG. 11 displays a line RT2 starting from the index P1 to the index P2 through the components 32 and 33. In a case where the robot 10 is operated in the initial path indicated by the line RT2, it is obvious that the collision between the robot 10 and the components 32 and 33 occurs. In contrast, the line RT1 in FIG. 10 starts from the index P1 to reach the index P2 by bypassing the components 32 and 33, and operating the robot 10 in the path indicated by the line RT1 would not cause the collision between the robot 10 and the components 32 and 33.

As described above, by drawing the model M2 of the workpiece 30 together with the indices P11 to P15 indicating via-points, it is possible to visually confirm the validity of the generated path. Moreover, by also displaying the path RT1 indicating the path, it is possible to confirm the validity of the generated path with further clarity.

While the above-described procedure is an exemplary case where the specified job stored in the job storage module 112 is modified by the generated path, the path generation module 133 may first generate a copy of the specified job and may then modify the copy.

(Procedure from Index Selection to Path Correction)

Figure 12:
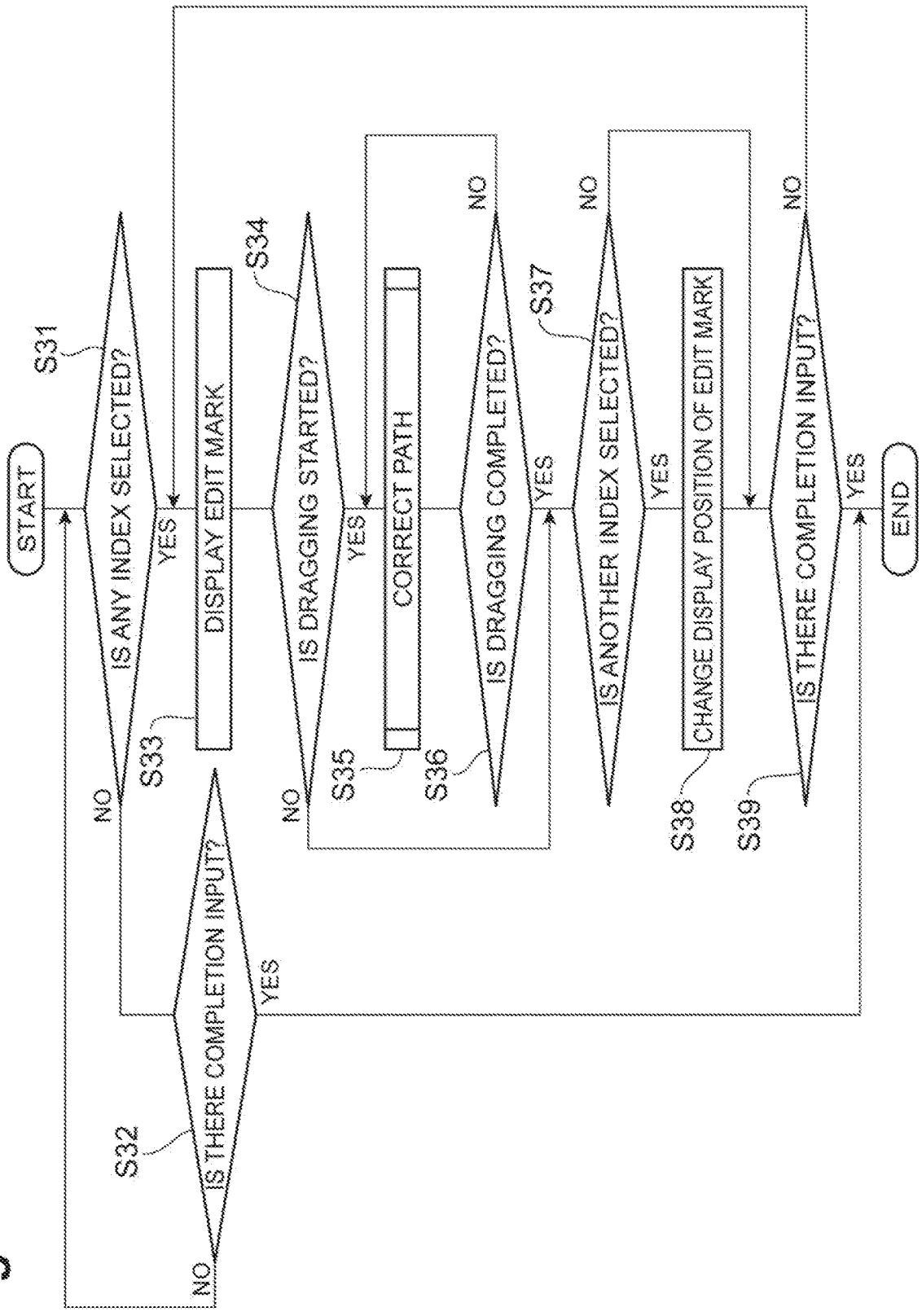
FIG. 12 is a flowchart illustrating a procedure from index selection to path correction.

As illustrated in FIG. 12, the robot simulator 100 first executes step S31. In step S31, the correction input acquisition module 123 confirms the presence or absence of an input of selecting an index of any of the via-points.

In a case where it is determined in step S31 that there is no input or that the index has not been selected, the robot simulator 100 executes step S32. In step S32, the correction input acquisition module 123 confirms whether there is an input of completing path correction (hereinafter referred to as a "completion input") to the input apparatus 191. Specific examples of the completion input include an operation input to the playback button 312, an input of closing the main window 300.

In a case where it is determined in step S32 that there is no completion input, the robot simulator 100 returns the processing to step S31. Thereafter, the robot simulator 100 waits for either an input indicating the selection of an index or a completion input.

In a case where it is determined in step S31 that the index has been selected, the robot simulator 100 executes step S33. In step S33, the correction input acquisition module 123 outputs a command of adding an edit mark EM (refer to FIG. 13) to the selected index to the image data output module 118, and the image data output module 118 outputs the image data corresponding to the command to the monitor 192. Hereinafter, the index to which the edit mark EM is attached will be referred to as an "active index". The active index can be moved by operation input (for example, input by dragging) by the input apparatus 191.

Next, the robot simulator 100 executes step S34. In step S34, the correction input acquisition module 123 confirms whether the operation input of moving the active index has been started.

In a case where it is determined in step S34 that the operation input of moving the active index has been started, the robot simulator 100 executes step S35. In step S35, the information processing module 130 executes processing of correcting the path in accordance with the movement of the active index. Details of the processing content in step S35 will be described below.

Next, the robot simulator 100 executes step S36. In step S36, the correction input acquisition module 123 confirms whether the operation input of moving the active index has been completed.

In a case where it is determined in step S36, that the operation input of moving the active index has not been completed, the robot simulator 100 returns the processing to step S35. Thereafter, path correction according to the movement of the active index is repeated until the operation input of moving the active index is completed.

In a case where it is determined in step S36, that the operation input of moving the active index has been completed, the robot simulator 100 executes step S37. In a case where it is determined in step S34, that the operation input of moving the active index has not been started, the robot simulator 100 executes step S37 without executing steps S35 and S36. In step S37, the correction input acquisition module 123 confirms the presence or absence of an operation input of selecting an index of another via-point.

In a case where it is determined in step S37 that the index of another via-point has been selected, the robot simulator 100 executes step S38. In step S38, the correction input acquisition module 123 outputs a command of changing the position of the edit mark EM to the position of the newly selected index to the image data output module 118, and then, the image data output module 118 outputs the image data corresponding to this command to the monitor 192.

Next, the robot simulator 100 executes step S39. In a case where it is determined in step S37 that there is no operation input or that the index of another via-point has not been selected, the robot simulator 100 executes step S39 without executing step S38. In step S39, the correction input acquisition module 123 confirms the presence or absence of the above-described completion input.

In a case where it is determined in step S39 that there is no completion input, the robot simulator 100 returns the processing to step S33. Thereafter, path corrections according to the movement of the active index and the change in the active index are repeated in accordance with the operation input to the input apparatus 191 until the completion input is performed. In a case where it is determined in any of steps S32 and S39 that there is a completion input, the robot simulator 100 completes the processing.

(Detailed Procedure of Path Correction)

Figure 14:
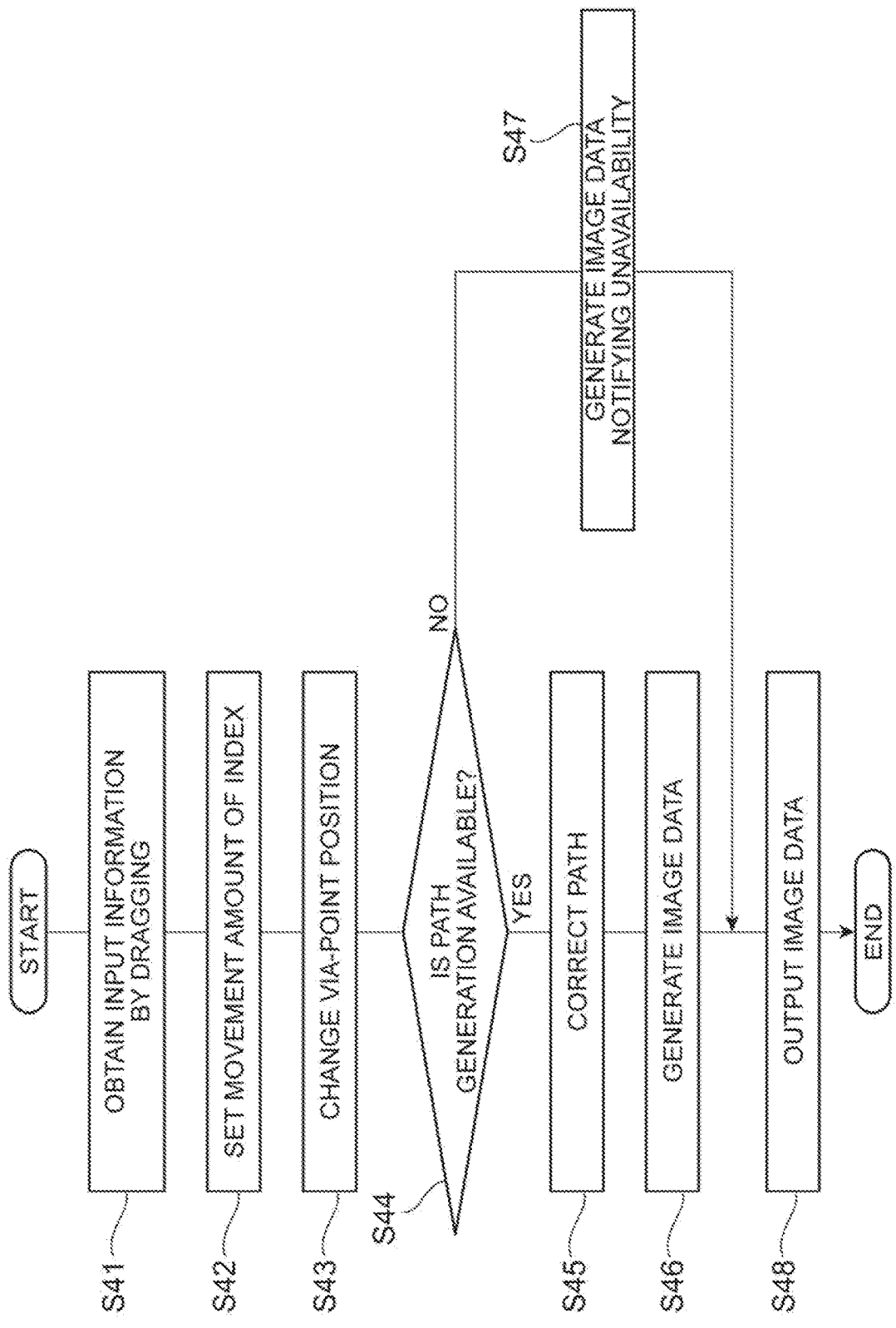
FIG. 14 is a flowchart illustrating a detailed procedure of path correction.

Subsequently, a detailed procedure of the processing in step S35 will be described. As illustrated in FIG. 14, the robot simulator 100 first executes step S41. In step S41, the correction input acquisition module 123 obtains input information for moving the active index.

Next, the robot simulator 100 executes step S42. In step S42, the correction input acquisition module 123 sets an amount of movement of the active index in accordance with the information obtained in step S41.

Next, the robot simulator 100 executes step S43. In step S43, the via-point correction module 135 changes the position of the via-point in accordance with the amount of movement of the active index.

Next, the robot simulator 100 executes step S44. In step S44, the path generation propriety determination module 136 determines the propriety of the generation of a path that passes through the changed via-point (the via-point whose position has been changed in step S43). For example, the path generation propriety determination module 136 determines whether the changed via-point satisfies the above-described conditions i) to iii).

In a case where it is determined in step S44 that a path passing through the changed via-point can be generated, the robot simulator 100 executes step S45. In step S45, the corrected path generation module 137 regenerates the path so as to pass through the changed via-point, and applies the path to the above-described modified job stored in the job storage module 112. In other words, the via-point of the path is inserted into the section as the path generation target among the modified jobs.

Next, the robot simulator 100 executes step S46. In step S46, the position of the active index is changed with the amount of movement set in step S43, the position of the edit mark EM is also changed accordingly, and furthermore, the image data generation module 134 regenerates the image data with the path line changed so as to pass through the changed active index.

In a case where it is determined in step S44 that generation of a path passing through the changed via-point is unavailable, the robot simulator 100 executes step S47. In step S47, the image data generation module 134 generates image data notifying that path generation is unavailable (hereinafter referred to as "image data notifying unavailability"). The image data notifying unavailability may be any image as long as the unavailability of path generation is visually recognizable. For example, the image data generation module 134 may generate image data with the color of the robot 10 or the background color of the drawing frame 330, or the like, as the image data notifying unavailability. The color associated with the generated image data being changed or different from a color of the image data in a case where the path generation is available.

After executing one of step S46 and step S47, the robot simulator 100 executes step S48. In step S48, the image data output module 118 obtains the image data generated in one of step S46 and step S47 from the image data generation module 134, and outputs the obtained image data to the monitor 192. This completes the above-described step S35.

Figure 13:
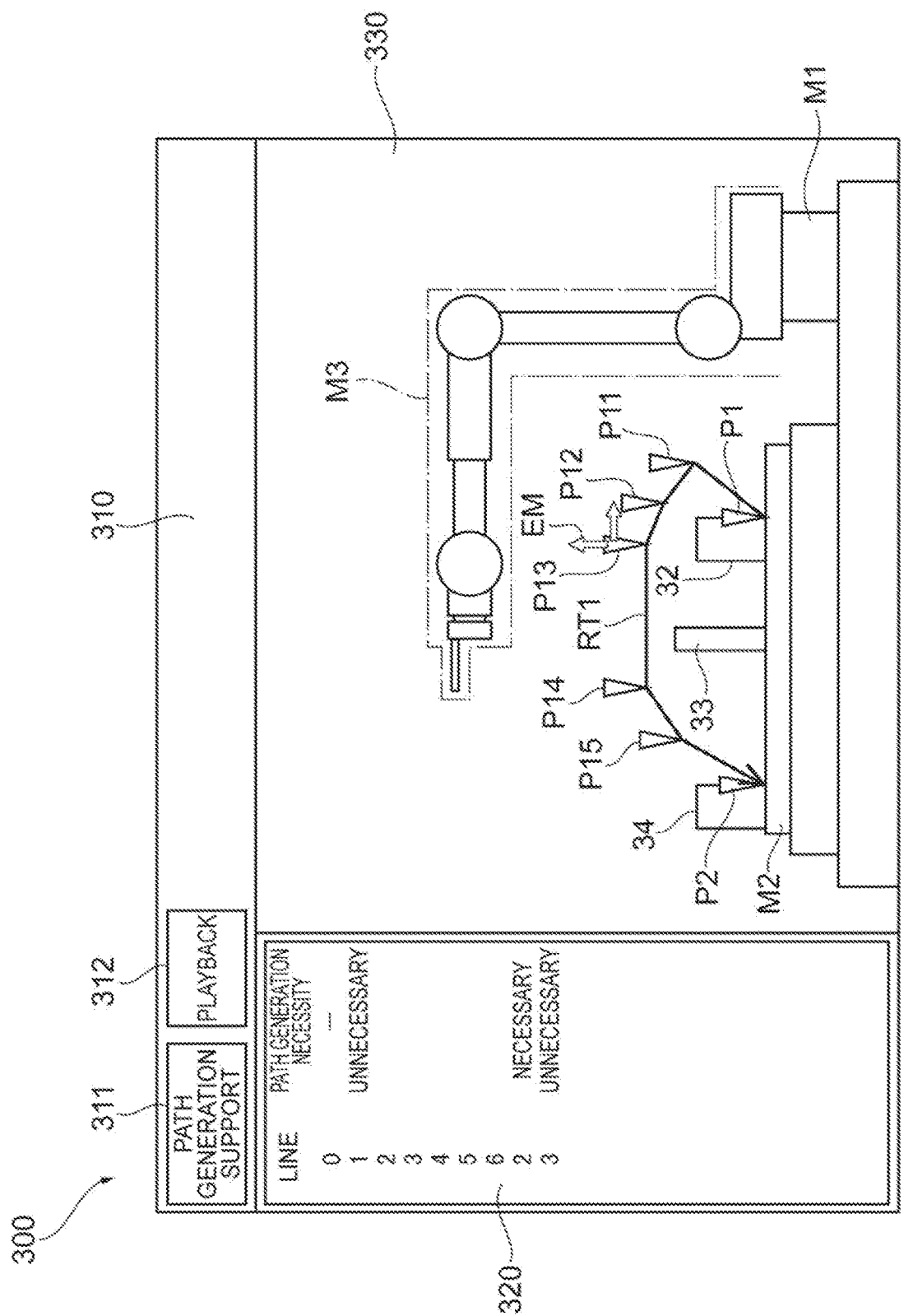
FIG. 13 is a schematic diagram illustrating a screen displaying edit marks of via-points.
Figure 15:
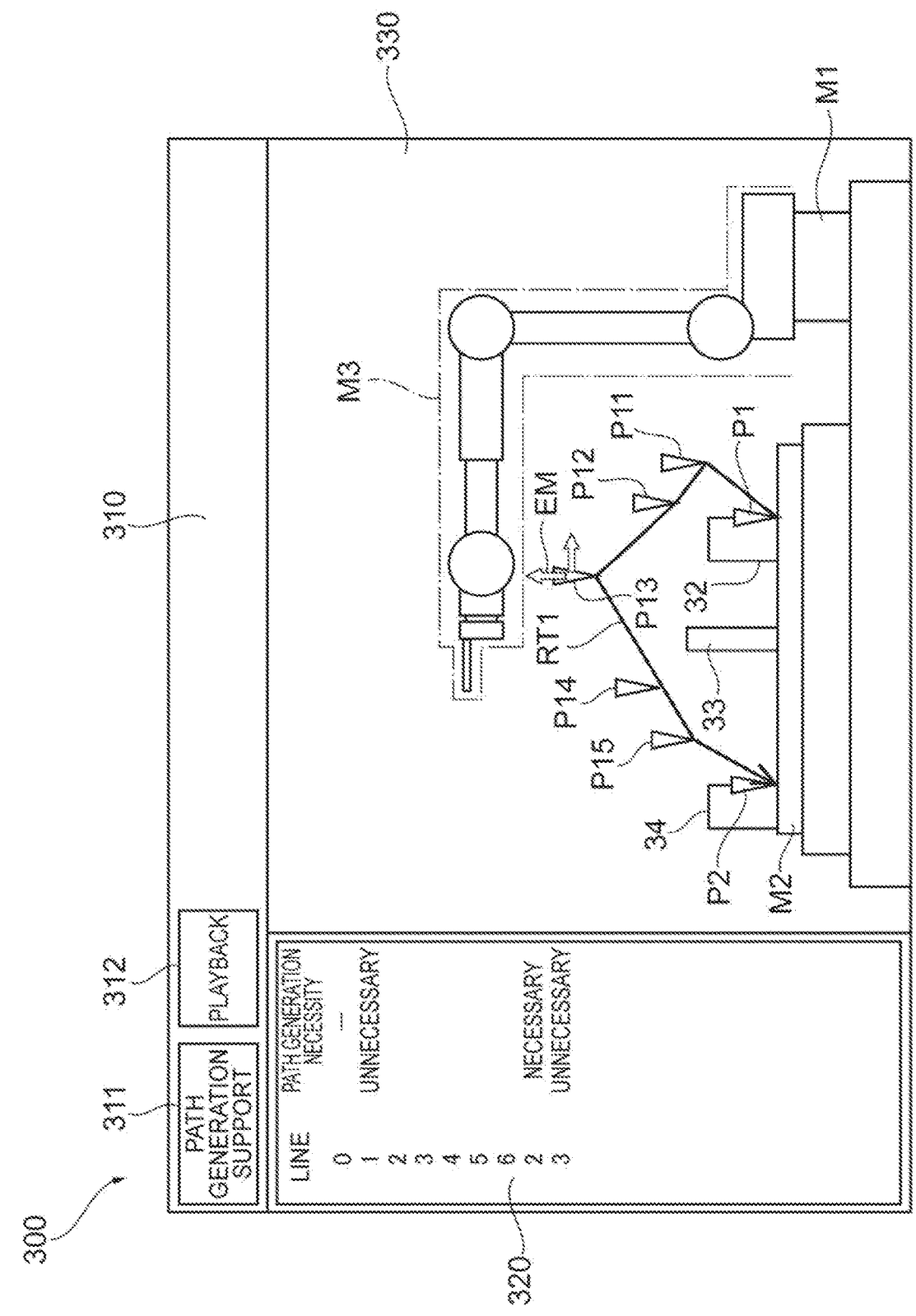
FIG. 15 is a schematic diagram illustrating a screen displaying the corrected path.

FIG. 15 is a schematic diagram illustrating an image displayed on the monitor 192 in step S48, illustrating a case where the position of the index P13 in FIG. 13 has been changed and the line RT1 of the path has been changed accordingly.

(Procedure of Moving Image Playback Processing)

Figure 16:
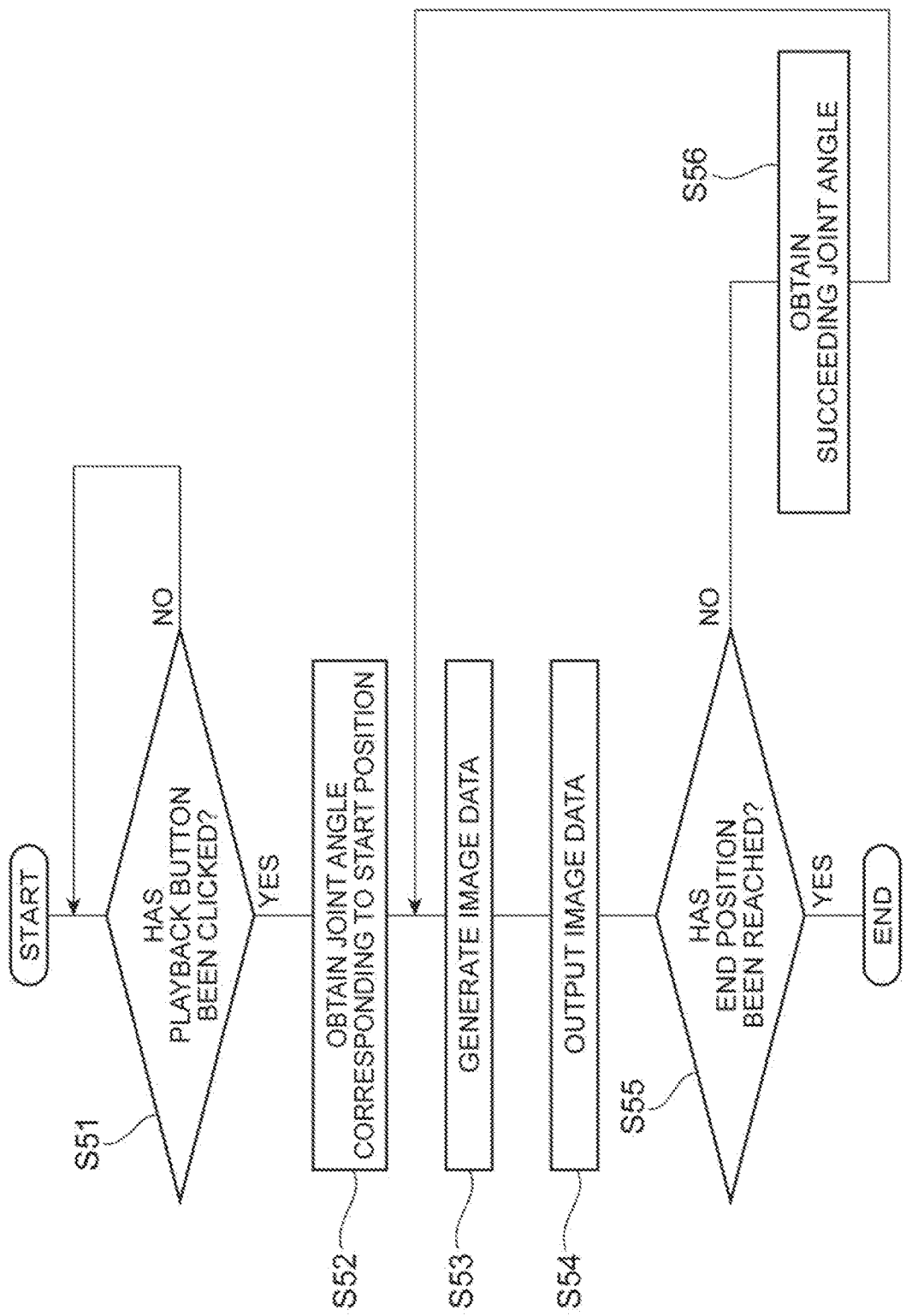
FIG. 16 is a flowchart illustrating a procedure of moving image playback processing.

As illustrated in FIG. 16, the robot simulator 100 first executes step S51. In step S51, the moving image data generation module 138 waits for an operation input to the playback button 312.

Next, the robot simulator 100 executes step S52. In step S52, the moving image data generation module 138 obtains angles of the joints J1 to J6 corresponding to the job start position from the job storage module 112. Hereinafter, the angles of the joints J1 to J6 obtained by the moving image data generation module 138 will be referred to as "simulation angles".

Next, the robot simulator 100 executes step S53. In step S53, based on the model information stored in the model storage module 111 and the job stored in the job storage module 112, the moving image data generation module 138 generates image data including a diagram of the robot 10 to which the simulation angle is applied, a diagram of the workpiece 30, the index indicating the via-point of the path, and the line indicating the path.

Next, the robot simulator 100 executes step S54. In step S54, the image data output module 118 obtains the image data generated in step S53 from the moving image data generation module 138, and outputs the obtained image data to the monitor 192.

Next, the robot simulator 100 executes step S55. In step S55, the moving image data generation module 138 confirms whether the distal end portion 16 of the robot 10 to which the simulation angle is applied has reached the end position of the job.

In a case where it is determined in step S55 that the distal end portion 16 has not reached the end position of the job, the robot simulator 100 executes step S56. In step S56, the moving image data generation module 138 obtains angles of the joints J1 to J6 corresponding to a succeeding position on the path (for example, the position after passage of a predetermined time) from the job storage module 112.

Figure 17:
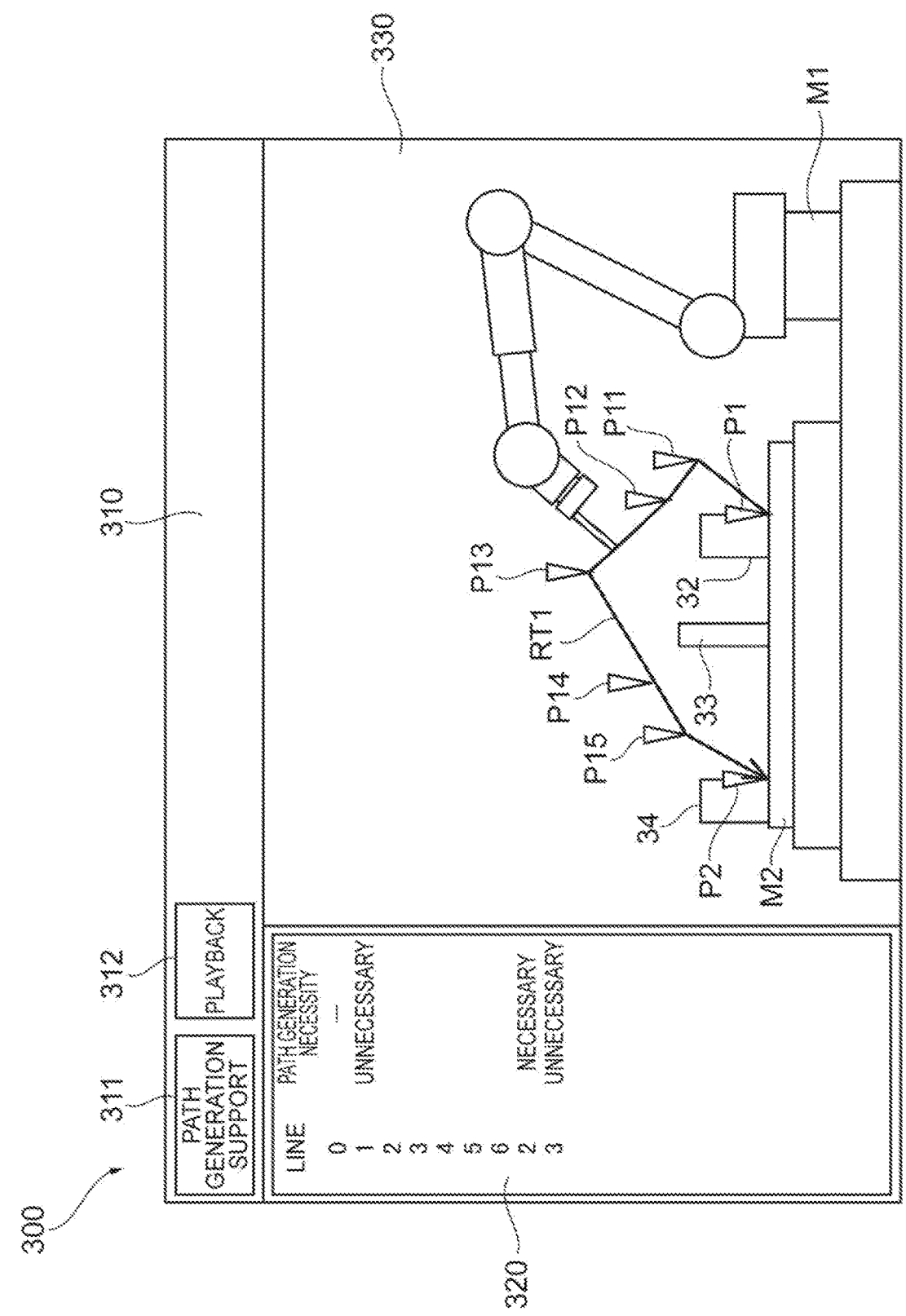
FIG. 17 is a schematic diagram illustrating a screen during playback of a moving image.

Thereafter, the robot simulator 100 returns the processing to step S53. Thereafter, the position change of the distal end portion 16 along the path, the corresponding simulation angle change in the joints J1 to J6, and generation and output of image data according to the changed simulation angle are repeated until the distal end portion 16 reaches the end position of the job. With this configuration, the operation of the robot 10 in the case of moving the distal end portion 16 along the path is displayed as a moving image (refer to FIG. 17).

In a case where it is determined in step S55 that the distal end portion 16 of the robot 10 has reached the end position of the job, the robot simulator 100 completes the moving image playback processing. By displaying the operation of the robot 10 according to the job including the generated path as a moving image, it is possible to confirm the validity of the generated path with further clarity.

Effects of Present Embodiments

As described above, the robot simulator 100 includes: the model storage module 111 storing model information related to the robot 10 and an obstacle in the vicinity of the robot 10; the information acquisition module 120 configured to obtain first input information defining a start position and an end position of operation of the robot 10; and the information processing module 130 configured to execute generation of a path for moving the distal end portion 16 of the robot 10 from the start position to the end position while avoiding a collision between the robot 10 and the obstacle based on the first input information and the model information, and to execute generation of image data including an illustration of the obstacle and an index indicating a via-point of the path.

According to the robot simulator 100, a path for moving the distal end portion 16 of the robot 10 from the start position to the end position while avoiding a collision between the robot 10 and the obstacle is automatically generated. Moreover, since image data including the illustration of the obstacle and the index indicating the via-point of the path is generated, it is possible to visually illustrate or confirm the relationship between the obstacle and the automatically generated path using the image data. This makes it possible to facilitate determination of path adoptability, fine adjustment of a path, or the like. Accordingly, this achieves an effect of facilitating the instruction and operation of the robot 10.

The information acquisition module 120 is further configured to obtain the second input information for changing the position of the via-point, and the information processing module 130 may further be configured to execute regeneration of the path so as to pass through the via-point after a position change based on the second input information and generation of image data in which the position of the index has been changed based on the second input information. In this case, the path can be adjusted by intuitive operation of moving the via-point on the image. Moreover, since the image is updated after the position of the via-point is changed, it is possible to adjust the path while checking the state of the adjusted path. This achieves a further effect of facilitating the instruction and operation of the robot 10.

The information acquisition module 120 may further be configured to obtain the third input information defining a condition for regulating the number of times of path generation, and the information processing module 130 may be configured, in generation of the path, to execute repetition of generation of the path until the condition defined by the third input information is satisfied, and to execute selection of one path from among the plurality of generated paths. By selecting one path after obtaining the plurality of paths, it is possible to generate a path with higher quality (high robot operation efficiency, for example). Moreover, by making it possible to set conditions for regulating the number of times of path generation, it is possible to adjust the balance between the quality of the path and the generation time in accordance with the user's preference. This achieves a further effect of facilitating the instruction and operation of the robot 10.

The information acquisition module 120 may further be configured to obtain fourth input information defining the evaluation criterion of the path, and the information processing module 130 may be configured to select one path in accordance with the evaluation criterion defined by the fourth input information in the selection of the one path from among the plurality of paths. In this case, by enabling the specification of the evaluation criterion of the path, it is possible to generate a path that is further focused on the user's requests. This achieves a further effect of facilitating the instruction and operation of the robot 10.

The information acquisition module 120 may further be configured to obtain fifth input information defining an accessible distance to the robot 10, and the information processing module 130 may further be configured to execute the generation of an outer shell model covering the robot 10 while maintaining the accessible distance determined based on the fifth input information, and to generate a path for moving the distal end-portion 16 from the start position to the end position while avoiding a collision between the outer shell model and the obstacle in generation of the path. In a case where the distal end portion 16 of the robot 10 moves along the path, an interval corresponding to at least the accessible distance is maintained between the robot 10 and the obstacle. This makes it possible to allow a certain degree of deviation between a track in which the distal end portion 16 of the robot 10 actually moves and the generated path. It is also possible to simplify the shape of the outer shell model and to enhance the path generation speed. This achieves a further effect of facilitating the instruction and operation of the robot 10.

The information acquisition module 120 may further be configured to obtain sixth input information defining the posture condition of the distal end portion 16 of the robot 10, and the information processing module 130 may be configured to generate the path such that the posture of the distal end portion 16 satisfies the posture condition defined by the sixth input information in generation of the path. This makes it possible to generate a path while satisfying the posture condition desired by the user. This achieves a further effect of facilitating the instruction and operation of the robot 10.

The information acquisition module 120 may further be configured to obtain seventh input information defining a movable ranges of the joints J1 to J6 of the robot 10, and the information processing module 130 may be configured to generate a path such that the operation angles of the joints J1 to J6 satisfy the movable range defined by the seventh input information in generation of the path. In this case, by setting the movable ranges of the joints J1 to J6 to be smaller than the structural movable ranges, it is possible to generate a path with room for further change in the joint angles. This further facilitates the task of finely adjusting the path after generating the path. This achieves a further effect in facilitating the instruction and operation of the robot 10.

While the embodiments have been described above, the present invention is not necessarily limited to the above-described embodiments, and various modifications are possible without departing from the spirit and scope of the present invention.

Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modification as would fall within the scope and spirit of the inventions.

Certain aspects, advantages, and novel features of the embodiment have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

What is claimed is:

1. A robot simulator comprising:
   a storage device that stores model information related to a robot, one or more workpieces, and an obstacle in the vicinity of the robot;
   an acquisition device configured to obtain first input information defining a start position and an end position of operation of the robot, wherein a tool end of the robot is configured to operate on the one or more workpieces at the start position and at the end position; and a processing device configured to execute a plurality of operations comprising:
   generating a repositioning path including a plurality of automatically generated via-points for removing the tool end from the one or more workpieces at the start position and moving the tool end along the repositioning path to the end position while avoiding a collision between the robot and the obstacle based on the first input information and the model information;
   generating image data including an illustration of the obstacle and the repositioning path for moving the tool end that passes through the via-points on a user interface;
   receiving user input via the user interface to reposition at least one of the via-points of the repositioning path to a user-selected position as a modified via-point, wherein the tool end does not operate on the one or more workpieces at the modified via-point;
   obtaining accessibility input information defining a predetermined non-zero minimum accessible distance to the robot;
   generating an outer shell model that substantially surrounds a surface of the robot with a minimum interval that is set to be equal to or greater than the predetermined non-zero minimum accessible distance;
   automatically checking whether the modified via-point of the repositioning path satisfies a correction condition requiring that no collision occurs between the robot and the obstacle while the tool end is located at the modified via-point;
   in response, at least in part, to determining that the modified via-point satisfies the correction condition, correcting the repositioning path as a modified path for moving the tool end from the start position to the end position, the modified path passing through the modified via-point, wherein correcting the repositioning path comprises generating the plurality of automatically generated via-points for moving the tool end of the robot from the start position to the end position while avoiding a collision between the outer shell model of the robot and the obstacle by maintaining the predetermined non-zero minimum accessible distance between the surface of the robot and the obstacle;
   generating image data including an illustration of the obstacle and the modified path that passes through the modified via-point; and
   transmitting the modified path to a robot controller to control the robot so as to move the tool end along the modified path.

2. The robot simulator according to claim 1,
wherein the acquisition device is further configured to obtain regulating input information defining a condition for regulating the number of times the repositioning path is generated, and
wherein the processing device is further configured, in generation of the repositioning path, to execute operations comprising:
  repeating the generation of the repositioning path until the condition defined by the regulating input information is satisfied; and
  selecting one path from among a plurality of generated paths that corresponds to the condition that is satisfied.

3. The robot simulator according to claim 2,
wherein the acquisition device is further configured to obtain evaluation input information defining an evaluation criterion of the plurality of generated paths, and
wherein the operation of selecting one path further comprises selecting the one path from the plurality of generated paths in accordance with the evaluation criterion defined by the evaluation input information.

4. The robot simulator according to claim 3,
wherein the acquisition device is configured to obtain the evaluation input information that specifies the one path of the plurality of generated paths that is associated with a shortest duration of time for movement of the tool end of the robot from the start position to the end position.

5. The robot simulator according to claim 4,
wherein the acquisition device is further configured to obtain evaluation input information that specifies the repositioning path of the plurality of generated paths that is associated with a least amount of power consumption of the robot to determine a movement of the tool end of the robot along the repositioning path.

6. The robot simulator according to claim 1,
wherein the robot comprises a plurality of joints associated with a plurality of joint angles which vary as the tool end of the robot moves along the repositioning path,
wherein the processing device is configured to generate a plurality of paths, and
wherein the acquisition device is further configured to:
  accumulate a combined angular change of the plurality of joint angles of the robot during each movement of the tool end of the robot along the repositioning path; and
  compare the accumulated combined angular change for each of the plurality of generated paths to select the repositioning path of the plurality of generated paths that is associated with a smallest total operation angle.

7. The robot simulator according to claim 1,
wherein the acquisition device is further configured to obtain posture input information defining a posture condition of the tool end of the robot, and
wherein the operation of generating a repositioning path further comprises generating the repositioning path such that a posture of the tool end satisfies the posture condition defined by the posture input information.

8. The robot simulator according to claim 1,
wherein the acquisition device is further configured to obtain range input information defining a movable range of joints of the robot, and
wherein the operation of generating a repositioning path further comprises generating the repositioning path such that operation angles of the joints satisfy the movable ranges defined by the range input information.

9. The robot simulator according to claim 1,
wherein the robot comprises a plurality of joints associated with a plurality of maximum allowable joint angles, and
wherein the operation of generating a repositioning path comprises repeating an operation of adding, to the repositioning path, one or more via-points satisfying a path generation condition requiring that no collision occurs between the robot and the obstacle, and requiring that a proposed posture of the tool end of the robot complies with the maximum allowable joint angles until the path generation condition is satisfied over an entire length of the repositioning path.

10. The robot simulator according to claim 1,
wherein, in response to determining that the modified via-point does not satisfy the correction condition, the processing device is further configured to generate image data comprising a notification that generating the modified path that passes through the modified via-point is unavailable.

11. The robot simulator according to claim 1,
wherein the storage device further stores a plurality of jobs, each of the jobs including a plurality of operating lines including a target position and a posture of the tool end of the robot and at least one section of the repositioning path between the operating lines,
wherein the acquisition device is configured to obtain information specifying one of the plurality of jobs as a first input information, and
wherein the operation of generating a repositioning path further comprises generating the repositioning path so that the target position and the posture at a start point of the at least one section included in the job specified by the first input information are set as the start position and so that the target position and the posture at an end point of the section are set as the end position.

12. A simulation method using a robot simulator, the method comprising:
  storing model information related to a robot and an obstacle in the vicinity of the robot;
  obtaining first input information defining a start position and an end position of operation of the robot, wherein a tool end of the robot is configured to operate on one or more workpieces at the start position and at the end position;
  generating a repositioning path including a plurality of automatically generated via-points for removing the tool end from the one or more workpieces at the start position and moving the tool end along the repositioning path to the end position while avoiding a collision between the robot and the obstacle based on the first input information and the model information;
  generating image data including an illustration of the obstacle and the repositioning path for moving the tool end that passes through the automatically generated via-points on a user interface;
  receiving user input via the user interface to reposition at least one of the via-points of the repositioning path to a user-selected position as a modified via-point, wherein the tool end does not operate on the one or more workpieces at the modified via-point;
  obtaining accessibility input information defining a predetermined non-zero minimum accessible distance to the robot;

generating an outer shell model that substantially surrounds a surface of the robot with a minimum interval that is set to be equal to or greater than the predetermined non-zero minimum accessible distance;
automatically checking whether the modified via-point of the repositioning path satisfies a correction condition requiring that no collision occurs between the robot and the obstacle while the tool end is located at the modified via-point;
in response, at least in part, to determining that the modified via-point satisfies the correction condition, correcting the repositioning path as a modified path for moving the tool end from the start position to the end position, the modified path passing through the modified via- point, wherein correcting the path comprises generating the plurality of automatically generated via-points for moving the tool end of the robot from the start position to the end position while avoiding a collision between the outer shell model of the robot and the obstacle by maintaining the predetermined non-zero minimum accessible distance between the surface of the robot and the obstacle;
generating image data including an illustration of the obstacle and the modified path that passes through the modified via-point; and
transmitting the modified path to a robot controller to control the robot so as to move the tool end along the modified path.

13. The simulation method according to claim 12,
wherein the robot comprises a plurality of joints associated with a plurality of joint angles which vary as the tool end of the robot moves along the path, and
wherein the method further comprises:
accumulating a combined angular change of the plurality of joint angles of the robot during each movement of the tool end of the robot along the path, and
comparing the accumulated combined angular change for each of the plurality of generated paths to determine the one path of the plurality of generated paths that is associated with a smallest total operation angle.

14. A robot simulator, comprising:
a storage device that stores model information related to a robot and an obstacle in the vicinity of the robot;
an acquisition device configured to obtain first input information defining a start position and an end position of operation of the robot, and to obtain accessibility input information defining a predetermined non-zero minimum accessible distance to the robot; and
a processing device configured to execute a plurality of operations comprising:
generating a single outer shell model that substantially surrounds a surface of the robot with a minimum interval that is set to be equal to or greater than the predetermined non-zero minimum accessible distance;
generating a path for moving a tool end of the robot based on the first input information and the model information, wherein the path is generated by automatically generating a plurality of via-points for moving the tool end from the start position to the end position while avoiding a collision between the outer shell model of the robot and the obstacle by maintaining the predetermined non-zero minimum accessible distance between the surface of the robot and the obstacle; and
transmitting the path to a robot controller to control the robot so as to move the tool end along the path.

15. The robot simulator according to claim 14,
wherein the acquisition device is further configured to obtain complexity input information defining a degree of complexity of the outer shell model, and
wherein the operation of generating an outer shell model further comprises generating the outer shell model in accordance with the complexity input information.

16. A non-transitory memory device having instructions stored thereon that cause a robot simulator to perform operations comprising:
storing model information related to a robot and an obstacle in the vicinity of the robot; obtaining first input information defining a start position and an end position of operation of the robot;
obtaining accessibility input information defining a predetermined non-zero minimum accessible distance to the robot;
generating a single outer shell model that substantially surrounds a surface of the robot with a minimum interval that is set to be equal to or greater than the predetermined non-zero minimum accessible distance;
generating a path for moving a distal end portion of the robot based on the first input information and the model information, the path including a plurality of automatically generated via-points for moving the distal end portion of the robot from the start position to the end position while avoiding a collision between the outer shell model of the robot and the obstacle by maintaining the predetermined non-zero minimum accessible distance between the surface of the robot and the obstacle;
generating image data including an illustration of the obstacle and the path that passes through the plurality of via-points; and
transmitting the path to a robot controller to control the robot so as to move the distal end portion along the path.

17. The non-transitory memory device according to claim 16, wherein the operations further comprise:
receiving user input via a user interface to reposition at least one of the via-points of the path to a user-selected position as a modified via-point, wherein the distal end portion does not operate on one or more workpieces at the modified via-point;
automatically checking whether the modified via-point of the path satisfies a correction condition requiring that no collision occurs between the robot and the obstacle while the distal end portion is located at the modified via-point; and
in response, at least in part, to determining that the modified via-point satisfies the correction condition, correcting the path as a modified path for moving the distal end portion from the start position to the end position, the modified path passing through the modified via-point.

18. A simulation method using a robot simulator, the method comprising:
storing model information related to a robot and an obstacle in the vicinity of the robot;
obtaining first input information defining a start position and an end position of operation of the robot;
obtaining accessibility input information defining a predetermined non-zero minimum accessible distance to the robot;
generating a single outer shell model that substantially surrounds a surface of the robot with a minimum interval that is set to be equal to or greater than the predetermined non-zero minimum accessible distance;

generating a path for moving a distal end portion of the robot based on the first input information and the model information, the path including a plurality of automatically generated via-points for moving the distal end portion of the robot from the start position to the end position while avoiding a collision between the outer shell model of the robot and the obstacle by maintaining the predetermined non-zero minimum accessible distance between the surface of the robot and the obstacle; and transmitting the path to a robot controller to control the robot so as to move the distal end portion along the path.

\* \* \* \* \*